(12) United States Patent
Wang et al.

(10) Patent No.: US 11,334,497 B2
(45) Date of Patent: *May 17, 2022

(54) EFFICIENT SEGMENT CLEANING EMPLOYING LOCAL COPYING OF DATA BLOCKS IN LOG-STRUCTURED FILE SYSTEMS OF DISTRIBUTED DATA SYSTEMS

(71) Applicant: VMware, Inc., Palo Alto, CA (US)

(72) Inventors: Wenguang Wang, Santa Clara, CA (US); Vamsidhar Gunturu, Cupertino, CA (US)

(73) Assignee: VMware, Inc., Palo Alto, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 16/914,171

(22) Filed: Jun. 26, 2020

(65) Prior Publication Data
US 2021/0382826 A1    Dec. 9, 2021

Related U.S. Application Data

(63) Continuation-in-part of application No. 16/894,646, filed on Jun. 5, 2020, now Pat. No. 11,144,394, and
(Continued)

(51) Int. Cl.
*G06F 12/10* (2016.01)
*G06F 12/00* (2006.01)
(Continued)

(52) U.S. Cl.
CPC .......... *G06F 12/10* (2013.01); *G06F 16/1805* (2019.01); *H03M 13/154* (2013.01); *G06F 2212/657* (2013.01)

(58) Field of Classification Search
CPC ............ G06F 11/1076; G06F 16/2246; G06F 16/1805; G06F 11/1004; G06F 12/10; G06F 2212/657; G06F 16/27; H03M 13/154

See application file for complete search history.

(56) References Cited

U.S. PATENT DOCUMENTS

| 8,019,938 B2 * | 9/2011 | Flynn ........................ G06F 9/54 |
| | | 711/113 |
| 8,953,269 B1 * | 2/2015 | Hamilton ............. G11B 19/041 |
| | | 360/48 |

(Continued)

OTHER PUBLICATIONS

Ex Parte Quayle Action received for U.S. Appl. No. 16/914,149, dated Aug. 4, 2021, 7 pages.
(Continued)

*Primary Examiner* — Justin R Knapp
(74) *Attorney, Agent, or Firm* — Dentons US LLP

(57) ABSTRACT

Client data is structured as a set of data blocks. A first subset of data blocks is stored on a current segment of a plurality of disks. A second subset of data blocks is stored on a previous segment. A request to clean client data is received. The request includes a request to update the current segment to include the second subset of data blocks. The second subset of data blocks is accessed and transmitted from a lower layer to a higher layer of the system. Parity data is generated at the higher layer. The parity data is transmitted to the lower layer. The lower layer is employed to generate a local copy of the second subset of data blocks. Each local address that references the local copy of the second subset of data blocks is included in the current segment. The parity data is written in the current segment.

31 Claims, 13 Drawing Sheets

Related U.S. Application Data a continuation-in-part of application No. 16/894,663, filed on Jun. 5, 2020.

(51) Int. Cl.
*G06F 16/18* (2019.01)
*H03M 13/15* (2006.01)
*H03M 13/00* (2006.01)

(56) References Cited

U.S. PATENT DOCUMENTS

| | | | |
|---|---|---|---|
| 10,866,869 B2* | 12/2020 | Li | G06F 16/188 |
| 11,144,394 B1 | 10/2021 | Wang et al. | |
| 2008/0263089 A1* | 10/2008 | Cousins | G06F 3/0689 |
| 2013/0205114 A1* | 8/2013 | Badam | G06F 11/1076 711/207 |
| 2015/0227602 A1 | 8/2015 | Ramu et al. | |
| 2016/0291881 A1 | 10/2016 | Li | |
| 2017/0242785 A1 | 8/2017 | O'Krafka et al. | |
| 2019/0188156 A1 | 6/2019 | Sampathkumar et al. | |

OTHER PUBLICATIONS

Non-Final Office Action received for U.S. Appl. No. 16/914,166, dated Aug. 4, 2021, 8 pages.

Notice of Allowance received for U.S. Appl. No. 16/894,646, dated Jun. 11, 2021, 9 pages.

U.S. Appl. No. 16/894,663, filed Jun. 5, 2020, titled "Efficient Erasure-Coded Storage in Distributed Data Systems".

U.S. Appl. No. 16/914,149, filed Jun. 26, 2020, titled "Efficient Accessing Methods for Bypassing Second Layer Mapping of Data Blocks in File Systems of Distributed Data Systems".

U.S. Appl. No. 16/914,166, filed Jun. 26, 2020, titled "Efficient Segment Cleaning Employing Remapping of Data Blocks in Log-Structured File Systems of Distributed Data Systems".

* cited by examiner

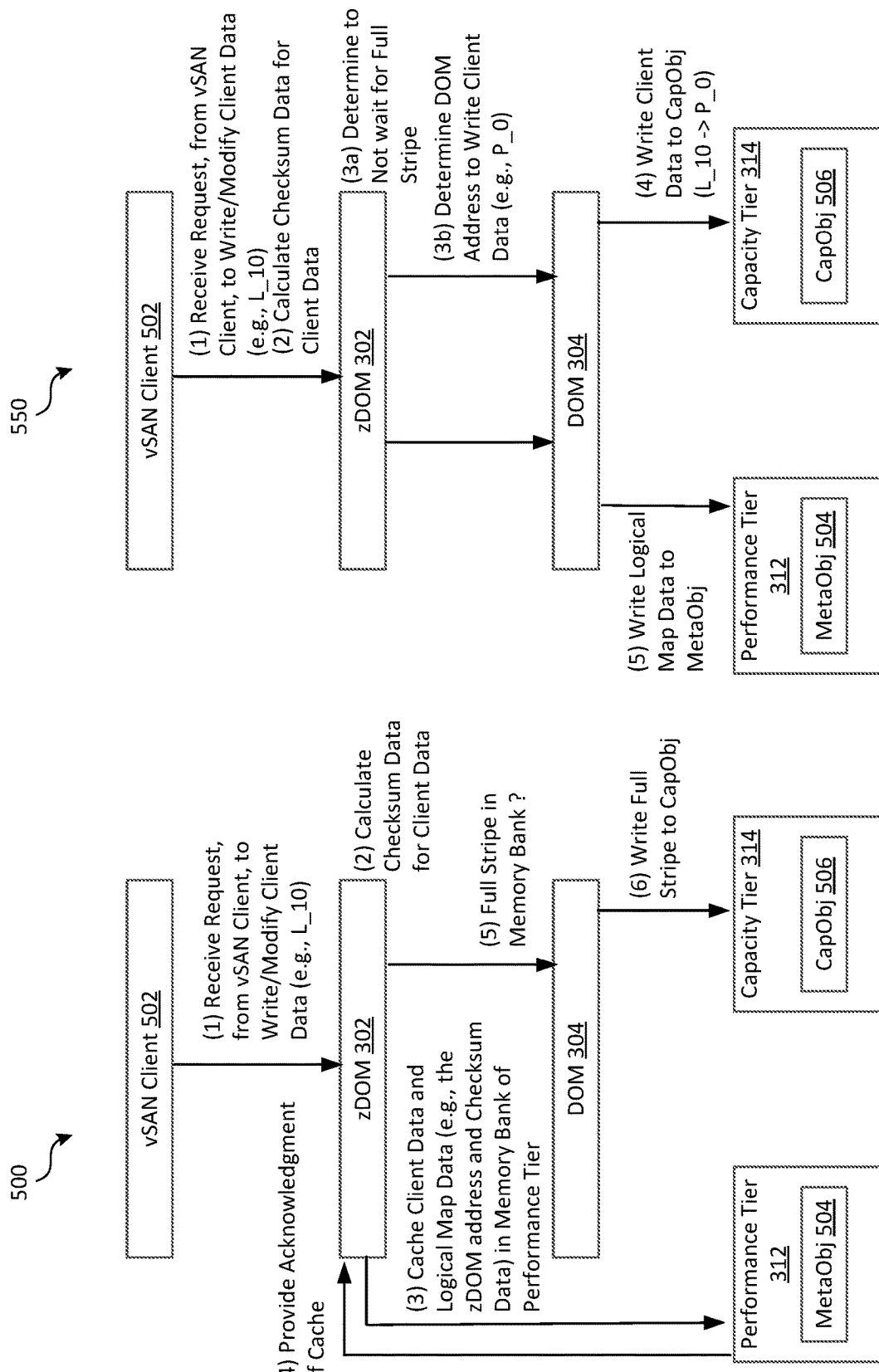

| 412 | Cap Disk A 394A | Cap Disk B 394B | Cap Disk C 394C | Cap Disk D 394D | Cap Disk P 394P | Cap Disk Q 394Q |
|---|---|---|---|---|---|---|
| 602 | P_0: L_30 | P_8: L_40 | P_16: L_50 | P_24: LOG_1 | PP_0: P_Data_0 | PQ_0: Q_Data_0 |
| 604 | P_1 | P_9 | P_17 | P_25 | PP_1 | PQ_1 |
| 606 | P_2 | P_10 | P_18 | P_26 | PP_2 | PQ_2 |
| 608 | P_3 | P_11 | P_19 | P_27 | PP_3 | PQ_3 |

FIG. 6A

| 412 | Cap Disk A 394A | Cap Disk B 394B | Cap Disk C 394C | Cap Disk D 394D | Cap Disk P 394P | Cap Disk Q 394Q |
|---|---|---|---|---|---|---|
| 602 | P_0: L_30 | P_8: L_40 | P_16: L_50 | P_24: LOG_1 | PP_0: P_Data_0 | PQ_0: Q_Data_0 |
| 604 | P_1: L_32 | P_9: L_42 | P_17: L_52 | P_25: L_62 | PP_1: P_Data_1 | PQ_1: Q_Data_1 |
| 606 | P_2: L_72 | P_10: L_82 | P_18: L_92 | P_26: LOG_2 | PP_2: P_Data_2 | PQ_2: Q_Data_2 |
| 608 | P_3 | P_11 | P_19 | P_27 | PP_3 | PQ_3 |

| Cap Disk A 394A | Cap Disk B 394B | Cap Disk C 394C | Cap Disk D 394D | Cap Disk P 394P | Cap Disk Q 394Q |
|---|---|---|---|---|---|
| P_0: L_30 | P_8: LOG_1 | P_16: | P_24: | PP_0: P_Data_0 | PQ_0: Q_Data_0 |
| P_1 | P_9 | P_17 | P_25 | PP_1 | PQ_1 |
| P_2 | P_10 | P_18 | P_26 | PP_2 | PQ_2 |
| P_3 | P_11 | P_19 | P_27 | PP_3 | PQ_3 |

| Cap Disk A 394A | Cap Disk B 394B | Cap Disk C 394C | Cap Disk D 394D | Cap Disk P 394P | Cap Disk Q 394Q |
|---|---|---|---|---|---|
| P_0: L_30 | P_8: FREE | P_16 | P_24 | PP_0: P_Data_0 | PQ_0: Q_Data_0 |
| P_1: L_40 | P_9: LOG_2 | P_17 | P_25 | PP_1: P_Data_1 | PQ_1: Q_Data_1 |
| P_2 | P_10 | P_18 | P_26 | PP_2 | PQ_2 |
| P_3 | P_11 | P_19 | P_27 | PP_3 | PQ_3 |

FIG. 6D

EFFICIENT SEGMENT CLEANING EMPLOYING LOCAL COPYING OF DATA BLOCKS IN LOG-STRUCTURED FILE SYSTEMS OF DISTRIBUTED DATA SYSTEMS

CROSS-REFERENCE TO RELATED APPLICATIONS

This application is a Continuation in Part of and claims priority to U.S. patent application Ser. No. 16/894,663, filed on Jun. 5, 2020, entitled "EFFICIENT ERASURE-CODED STORAGE IN DISTRIBUTED DATA SYSTEMS," which is hereby incorporated by reference in its entirety for all purposes. This application is a Continuation in Part of and further claims priority to U.S. patent application Ser. No. 16/894,646, filed on Jun. 5, 2020, entitled "STORING B-TREE PAGES IN CAPACITY TIER FOR ERASURE-CODED STORAGE IN DISTRIBUTED DATA SYSTEMS," which is hereby incorporated by reference in its entirety for all purposes

FIELD

The present disclosure relates generally to virtual storage area network (vSAN) in a distributed-computing system and, more specifically, to efficiently storing, accessing, and retrieving data in fault-tolerant distributed-computing systems using erasure coding (EC) mechanisms.

BACKGROUND

Designers of data storage systems strive to increase the input/output (I/O) efficiency of their systems. To such ends, designers often distribute data amongst multiple storage volumes (e.g., distributed data disks). One common family of techniques for such distributed storage includes a Redundant Array of Inexpensive Disks (RAID) architecture. Various RAID levels or schemes are known in the art. RAID 0 schemes employ striping the data to be stored. Striping data includes subdividing the data into separate portions (e.g., data blocks) and the separate data blocks are stored on (or distributed across) multiple storage disks. Because I/O operations may be simultaneously performed on the multiple disks, striping may increase the efficiency of the reading and writing of data on a distributed system, when the reading and/or writing operations on the separate disks are performed in parallel. That is, striping data may enable parallelization for certain data I/O operations. However, RAID 0 striping schemes are non-redundant, and the loss of any single disk may result in a loss of the stored data. Because disks are subject to failure (or at least lose the ability to reliably store and retrieve data over time), designers additionally strive to implement fault tolerance in their systems. RAID 1 schemes employ data mirroring, where identical copies of the stored data are stored on multiple disks. As long as at least one of the mirrored disks is reliable, the stored data may be accessed, retrieved, and/or recovered. However, mirroring of data necessitates significant redundancies and overhead. For example, although an N-way mirroring of data provides for an N-fold data redundancy, N-way mirroring requires a factor of N increased storage capacity.

Parity-based storage of data (e.g., calculating and storing parity data such as Hamming codes) provides an improvement over the significant redundancy factor associated with naïve data mirroring. Parity-based storage includes the computation of and storage of additional data (e.g., parity data) based on one or more combinations of the data to be stored (e.g., payload data). The volume of the parity data is typically smaller than the volume of the payload data. For example, the parity data may include one or more linear combinations of the payload data, which enable the deterministic re-construction of the payload data. The payload data may be stored on a separate disk than the parity data. If a portion of the data (e.g., a portion of the payload or the parity data) is lost due to a disk failure, the non-lost portion of the data may be employed to reconstruct (or compute) the lost portion. Because the volume of the parity data is smaller than the volume of the payload data, the increased storage capacity required for parity-based storage schemes is less than that required for mirroring of data. Conventional RAID 5 and RAID 6 storage schemes employ both data striping and parity (e.g., erasure coding (EC)), where RAID 6 includes more parity data (relative to RAID 5) to tolerate increased disk failure rates. For example, a RAID 5 system may tolerate the loss of a single disk, where a RAID 6 system may tolerate the simultaneous loss of two or more disks.

However, conventional EC may result in significant inefficiencies when writing data. In a conventional 4+2 RAID 6 scheme (e.g., a RAID 6 system that employs four data disks and two parity disks), a data stripe may include four payload data blocks and two parity data blocks. Each of the four payload blocks may be written to one of the four data disks and each of the two parity blocks may be written to one of the two parity disks. The modification (e.g., an updating or re-writing) of a single payload block within a stripe requires a modification of the two parity blocks of the stripe. The modification of the two parity blocks is based on a combination of the four payload blocks of the stripe. Thus, the modification of one of the four payload data blocks may require three read operations and three write operations.

For instance, to compute the combination of the four payload blocks in the stripe (required for the computation of the two parity data blocks), the other three payload blocks in the stripe may need to be read from the disks, which requires three read operations. Upon reading the three un-modified payload blocks, the single payload block to be modified may be combined with the three other payload blocks and the two parity blocks may be re-computed based on the combination. The modified payload block, as well as each of the two re-computed parity blocks may be written to the corresponding data and parity disks, requiring three read operations. Accordingly, in addition to the three read operations, the writing of a single block of data requires three write operations, resulting in a write amplification factor of three. Thus, although conventional EC may increase the fault tolerance and decrease the required capacity of distributed storage systems, EC may increase the I/O latency and generate both high read and write traffic of the system; ultimately limiting the performance of the storage system. This increased number of read and write operations required to modify and/or update a data block may be referred to as a read-modify-write problem of conventional erasure coding. The read-modify-write problem includes not only the need for read operations, but also a significant write amplification factor (e.g., a write amplification factor of three in the above example).

Overview

Described herein are techniques for storing a set of client data blocks in a distributed-computing system. In one embodiment, the system includes a capacity storage tier that includes a first plurality of storage disks. The first plurality of disks store a capacity data object structuring the set of client data blocks as plurality data stripes. The data stripes are erasure coded (EC) and distributed across the first plurality of disks. Each of the data stripes includes a subset of the set of client data blocks and corresponding parity data for the subset of client data blocks. The system may also include a performance storage tier that includes a second plurality of storage disks. The second plurality of disks include storing a metadata object that structures its data as being mirrored across the first plurality of disks. The metadata object includes an address map indicating, for each client data block of the set of client data blocks, a correspondence between a logical address associated with a first layer of the system and a physical address associated with a second layer of the system, and also an area of logging to log the data and metadata.

The system may further include one or more processors and a memory storing one or more programs. The programs may be configured to be executed by the one or more processors. The one or more programs including instructions for performing a method. The method comprises receiving a request from a client of the system. The request may be a request to include one or more additional client data blocks in the set of client data blocks. The request may indicate the logical address for each of the one or more additional client data blocks. The method may further comprise, for each of the one or more additional client data blocks, determining a corresponding physical address included in a current data stripe of the plurality of data stripes. Each of the one or more additional client data blocks may be stored at the corresponding physical address in the current data stripe of the capacity tier. Additional metadata may be stored in the metadata object. Storing the additional metadata includes storing data in the log area and after a full stripe of data is accumulated, updating the address map to indicate the correspondence between the logical address and the physical address for each of the one or more additional client data blocks.

The metadata object may structure the address map as a B-tree (or a binary tree when stored in RAM) that includes a plurality of leaf nodes and a plurality of index nodes. The plurality of index nodes may include pointers to each of the plurality of leaf nodes. The instructions may further be for performing another method. The other method includes determining a storage volume associated with the plurality of leaf nodes that are stored on the performance tier. The other method may additionally comprise, in response to the storage volume of the plurality of leaf nodes stored on the performance tier is greater than a predetermined volume threshold, migrating at least a portion of the plurality of leaf nodes to one or more of the plurality of data stripes of the capacity storage. A portion of the plurality of index nodes that include pointers to the migrated portion of the plurality of leaf nodes may be updated to include updated pointers to physical addresses of the one or more of the plurality of data stripes of the capacity storage that store the migrated portion of the plurality of leaf nodes. A portion of the performance tier that stored the migrated portion of the leaf nodes may be re-allocated to store additional logical map data.

In still other embodiments, a system may include a first distributed object manager (DOM), a second DOM, and a local object manage (LOM). The system may further include one or more processors a memory. The first DOM may be a striped DOM (e.g., a zDOM) and the LOM may be a Local Log Structured Data Object Manager (LSOM). The first DOM, the second DOM, and the LOM may be structured as hierarchical layers of the system, where the first DOM is the uppermost layer, the second DOM being a layer below the first DOM, and the LOM being a layer below the second DOM. Client data managed by the system be structured as a set of data blocks in the system. The first DOM may employ a set of logical addresses to reference the set of data blocks. The second DOM may employ a set of physical addresses to reference the set of data blocks. The LOM may employ a set of local addresses to reference the set of data blocks. First mapping data (e.g., zDOM logical map data) may encode a correspondence (or mapping) between the set of logical addresses, employed by the first DOM, and the set of physical addresses, employed by the second DOM. Second mapping data (e.g., LSOM logical map data), may encode a correspondence (or mapping) between the set of physical addresses, and the set of local addresses, employed by the LOM. Note that the terms DOM logical map and LSOM logical map may be employed interchangeably. For each instance when a particular data block of the set of data blocks is written, a LOM transaction ID (e.g., an LSOM transaction or generation ID) of a set of LOM transaction IDs may be generated. The generated LOM transaction ID may be associated with the local addresses that the particular data block was written to (e.g., the local address that the LOM employs to reference the particular data block). A usage table (e.g., a segment usage table) indicates a current status (e.g., valid or invalid) of each LOM transaction ID of the set of LOM transaction IDs.

The system may perform a non-limiting embodiment of a method for accessing and/or providing the client data to a client. One exemplary embodiment includes receiving, at the first DOM, a request to access a first data block of the set of data blocks. The request may indicate a first logical address of the logical set of addresses that references the first data block. The first mapping data may be employed to identify (or determine) a first physical addresses of the set of physical addresses that corresponds to the first logical addresses. The first mapping data may further encode a first LOM transaction ID and candidate local addresses of the set of local addresses. The LOM may have previously employed the candidate local address to reference (or access) the first data block. The first LOM transaction ID of the set of LOM transactions ID may be associated with the candidate local address. The first mapping data may be employed to identify (or determine) the candidate local address and the first LOM transaction ID. In some embodiments, the usage table may be employed to determine (or identify) the current status of the first LOM transaction ID. In some embodiments, and in accordance to determining that the current status of the first LOM transaction ID is valid, the candidate local address may be employed to access the first data block. In accordance to determining that the current status of the first LOM transaction ID is invalid, the second mapping data may be employed to identify (or determine) an updated local address of the set of local addresses. The updated local address may currently reference the first data block. The updated local address may be employed to access the first data block.

In some embodiments, the set of data blocks may be stored on a plurality of disks (e.g., a capacity tier). A first subset of set of data blocks may be stored on a current segment of the plurality of disks. A second subset of the set of data blocks is stored on a previous segment (e.g., a "dirty" segment) of the plurality of disks. Another exemplary embodiment of a method implemented by the system includes receiving, at the LOM, a request to clean client data. The request may include a request to update the current segment of the plurality of disks to include the second subset of data blocks (e.g., to include the live data blocks from the dirty segment in the current segment). The LOM may be employed to access the second subset of data blocks from the previous segment of the plurality of disks. The second subset of data blocks may be transmitted from the LOM to the second DOM. Parity data, based on the second subset of data blocks, may be generated at the second DOM. The parity data may be transmitted from the second DOM to the LOM. In some embodiment, the LOM may be employed to update the second mapping data. In the updated mapping of the second mapping data, each local address of the set of local addresses that references a data block of the second subset of data blocks may be included in the current segment of the plurality of disks. In other embodiments, the LOM may be employed to generate a local copy of each data block of the second subset of data blocks in the current segment. Each local address of the set of local addresses that references a data block of the second subset of data blocks (which were local copied to the current segment) may be included in the current segment of the plurality of disks. The LOM to write the parity data in the current segment of the plurality of disks.

BRIEF DESCRIPTION OF THE DRAWINGS

FIG. 5A is a block diagram illustrating actions of a full stripe write mode operation, in accordance with some embodiments.

FIG. 5B is a block diagram illustrating actions of a partial stripe write mode operation, in accordance with some embodiments.

FIGS. 6A-6D provide block diagrams illustrating various write transactions that include writing corresponding logical map data to the capacity tier, in accordance with some embodiments.

DETAILED DESCRIPTION

Figure 1B:
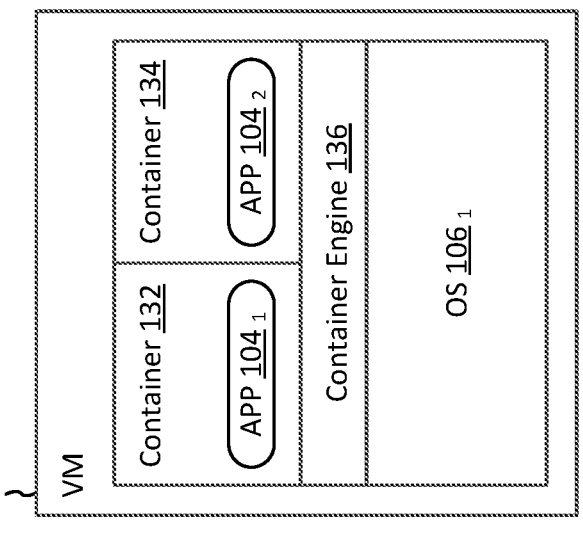
FIG. 1B is a block diagram illustrating a containerized application framework for implementing various components of a distributed-computing system, in accordance with some embodiments.

In the following description of embodiments, reference is made to the accompanying drawings in which are shown by way of illustration specific embodiments that can be practiced. It is to be understood that other embodiments can be used and structural changes can be made without departing from the scope of the various embodiments.

The embodiments are directed towards distributed computer systems (e.g., virtual storage area networks (vSAN)) that store and provide access to data. The data stored by a distributed system may be structured as a data object that includes discrete blocks of data (e.g., data blocks). More specifically, the embodiments include a distributed data storage architecture that provides for enhanced efficiency for the management (e.g., writing, modifying, reading, and/or accessing) of data, where the data is subdivided into data blocks, striped, and erasure coded (EC) to enable parallelized I/O operations (e.g., write and/or read) and fault tolerance (e.g., disk losses that do not lead to data loss). As discussed throughout, the embodiments provide benefits (e.g., increased efficiency), as compared to conventional erasure coding (EC). That is, the embodiments provide greater efficiency (e.g., decreased I/O latency, read traffic, write traffic, and the like) over conventional distributed storage systems (e.g., storage systems based on RAID 5 and RAID 6 architectures). The embodiments further provide greater performance than conventional systems subject to the read-modify-write problem discussed above. The embodiments may be deployed in various virtualized and/or distributed computing systems, such as but not limited to hyperconverged infrastructure (HCI) systems. The systems employing the various embodiments may be single-tiered or multi-tiered systems. The systems employing the embodiments may include one or more vSANs (e.g., vSAN clusters). The increased I/O efficiency is of great benefit for systems distributed across a communication network, where conventional I/O transactions on conventional distributed systems may require network traffic between disks and other components due to the distributed nature of the system.

In some embodiments, one or more storage disks employed in a vSAN may include a solid-state disk (SSD) or NVMe disk based on one or more non-volatile random access memory (NVRAM) technologies (e.g., FLASH, EEPROM, Persistent Memory or the like). The memory technologies employed in the embodiments may include the ability to store more than one bit in a cell. That is, the storage cells may be multi-level cells (MLCs). In some embodiments, each cell of the memory devices may store 2 bits (two-level cells), 3 bits (tri-level cells), 4 bits (quad-level cells), or even a larger number of bits (e.g., 5 bits per cell or penta-level cells). For example, an SSD employed in the embodiments may include multi-level, tri-level, or quad-level FLASH devices. Although, the embodiments are not limited, and the embodiments may employ more conventional magnetic disks (e.g., hard disks with spinning magnetic material and read/write heads). As discussed throughout, in some embodiments, a storage disk may be a virtualized storage disk.

The embodiments employ a combination of data striping and erasure coding (EC), and thus the systems employing the embodiments may be structured via various RAID 5 or RAID 6 or more generic Erasure Coding architectures. A system employing the various embodiments (e.g., a vSAN system) may be architected via a logical hierarchy that includes various logical layers structured in a hierarchical fashion. The embodiments include a logical layer that is added on top of another logical layer of the system. The layer below the added layer may manage the data to be stored and/or retrieved as a distributed data object, thus the lower layer may be referred to as a Distributed Object Manager (DOM). As discussed throughout, in the layered logical hierarchy of a vSAN, the DOM may be positioned above still one or more other logical layers (e.g., a Local Log Structured Data Object Manager (LSOM)) of the hierarchy.

The distributed data object managed by the DOM layer may be referred to as a DDO, or equivalently as a DOM object. The layer added on top of the DOM may manage the data to be stored and/or retrieved as a striped (and EC'ed) distributed data object, and may be referred to as a Zebra Distributed Object Manager (zDOM), where Zebra refers to the striping of the data. The striped distributed data object managed by the zDOM may be referred to as a zDDO, or equivalently as a zDOM object.

The DOM object and the zDOM object may encode the equivalent (or at least similar) underlying data, but the encoded data may be structured differently in the two data objects. That is, the zDOM may manage (e.g., write, access, and/or retrieve) data as a first data object and the DOM may manage data as a second data object. Thus, the logical address of a particular block of data at the zDOM level may be different from the logical address of the equivalent or corresponding particular block of data at the DOM layer. To account for the separate addresses, the embodiments may employ another data object (e.g., a zDOM logical map), which maps a logical address of a particular data block in the zDOM object to the corresponding logical address of the particular data block in the DOM object. The zDOM layer may treat and/or interact with the DOM layer as a physical layer of the vSAN. Accordingly, the zDOM map may be said to map a logical address of one or more blocks of data within the zDOM layer (or the zDOM object) to a physical address of the equivalent or corresponding one or more blocks of data within the DOM layer (or the DOM object). As referenced throughout, a physical address at the zDOM layer may be a logical address at the DOM layer. Thus, although the zDOM may treat the DOM address as a physical address, the DOM address may be a logical address that is mapped to a logical or physical address of another layer, or another data object, such as a LSOM layer, or LSOM data object. This additional mapping may be addressed by one or more other data objects encoding such other maps. As noted above, a zDOM layer may treat the DOM layer as a physical layer in a vSAN. Accordingly, the zDOM may add its own logical-to-physical map (e.g., the zDOM map), checksum, data caching, and the like to its own address space.

The embodiments may employ at least two separate tiers of data storage in vSAN: a capacity tier and a performance tier. The capacity tier has a significantly greater storage volume (or storage capacity) than the performance tier. The smaller performance tier may have an enhanced I/O throughput (e.g., greater performance and/or faster read and write operations), as compared to the capacity tier. The capacity tier may include a plurality of storage disks (e.g., SSDs) arranged and configured to store and/or retrieve a striped (and EC'ed) distributed data object. Thus, the disks of the capacity tier may be arranged and configured in a RAID 5 of RAID 6 or generic Erasure Coded architecture. As discussed below, because at least portions of the data stored on the capacity tier is striped and erasure coded (EC), the file system of the capacity tier may be a Log-Structured File System (LFS). The capacity tier may include another plurality of disks arranged to store and/or retrieve a mirrored data object. Thus, the disks of the capacity tier may be arranged in a RAID 1 mirroring architecture with no parity or data striping. As discussed below, at least portions of the data stored by the performance tier may be managed by conventional data overwrite methods. Thus, the file system of the performance tier may be more of a traditional disk file system designed to handle data overwrites.

In one non-limiting embodiment, the capacity tier includes six storage disks (e.g., either real or virtualized storage disks) arranged in a 4+2 RAID 6 architecture. In the 4+2 RAID 6 architecture, for a given data stripe, the payload data is distributed across four of the six disks and the parity data is distributed across the remaining two disks. The capacity tier may tolerate up to two simultaneous disk failures, and still be able to reconstruct the lost data stored on the two lost disks. It is understood that the 4+2 RAID 6 arrangement of the capacity tier is non-limiting, and in other embodiments, the capacity tier may be configured in a RAID 6 or erasure coded architecture that includes more than six disks, where more than two disks are parity disks for a particular stripe. Such embodiments may tolerate more than two disk failures. In one non-limiting embodiment, the performance tier may include three disks, arranged in a RAID 1 architecture, for a 3-way mirroring of the data stored on the performance tier. Thus, the performance tier may also tolerate two simultaneous disk failures. Similar to the capacity tier, these embodiments are non-limiting, and the performance tier may include N disks (where N is greater than 3) for N-way mirroring, providing greater fault tolerance.

In some embodiments, a zDOM data object may include one or more sub-data objects: a capacity data object (e.g., a CapObj) and/or a metadata data object (e.g., MetaObj). In general, the CapObj may be stored on the capacity tier and the MetaObj may be stored on the performance tier. As discussed throughout, as the MetaObj increases in size, at least portions of the MetaObj may be migrated to the capacity tier to free-up available space in the performance tier. Because the CapObj is stored on the capacity tier, (i.e., the data is striped and erasure coded), the data of the CapObj may be structured via a log-structured layout and managed by an LFS. As discussed throughout, at least portions of the data of the MetaObj may be structured as a B-tree, bitmap, or the like, and may be structured in a more traditional layout, which is managed by a more traditional file system that enables routine overwrites of the data.

As discussed throughout, the payload data (e.g., data to be stored and/or accessed by clients of a vSAN), the associated parity data, and/or the combination of the payload data and parity data may be referred to as client data. The capacity tier may store client data within the CapObj. In addition to client data, the various embodiments may employ metadata. The metadata may include the zDOM logical map, as well as other data associated with the client data (e.g., checksum data associated with the client data). As noted throughout, the logical map data may be stored within a tree format, such as but not limited to a B-tree. The performance tier may store at least portions of the logical map data within the MetaObj. The logical map data may be referred to as log data. As the MetaObj increases in size, at least portions of the logical map data stored on the performance tier may be migrated to the CapObj to free-up available space in the performance tier. For example, and as discussed throughout, as client data is stored in the CapObj, the corresponding logical map data may be written to (and mirrored) in the MetaObj. In embodiments that employ a B+tree to encode the logical map data, the bulk of the logical map data may be stored in the leaf (or terminal) nodes of the B-tree, whereas the non-leaf (or index) nodes of the B-tree store pointers to the corresponding leaf nodes. As the B-tree grows in size, leaf nodes may be migrated from the MetaObj to the CapObj, and the pointers in the non-leaf nodes (e.g., index nodes) may be updated to point to the corresponding blocks in the CapObj that now stores the corresponding leaf nodes. Because the index nodes consume significantly less storage than the leaf nodes, the index nodes may remain stored within the MetaObj on the performance tier. As discussed throughout, a leaf node of the logical map data (or another corresponding data object of the logical map data) may be referred to as a Logical Map Page. The collection of index nodes of the logical map data (or another corresponding data object of the logical map data) may be referred to as a Logical Map Tree. Whether a particular Logical Map Page is currently stored in the MetaObj or the CapObj, the Logical Map Tree includes an index entry that points to the current address (in the MetaObj or the CapObj) of the Logical Map Page.

Figure 4A:
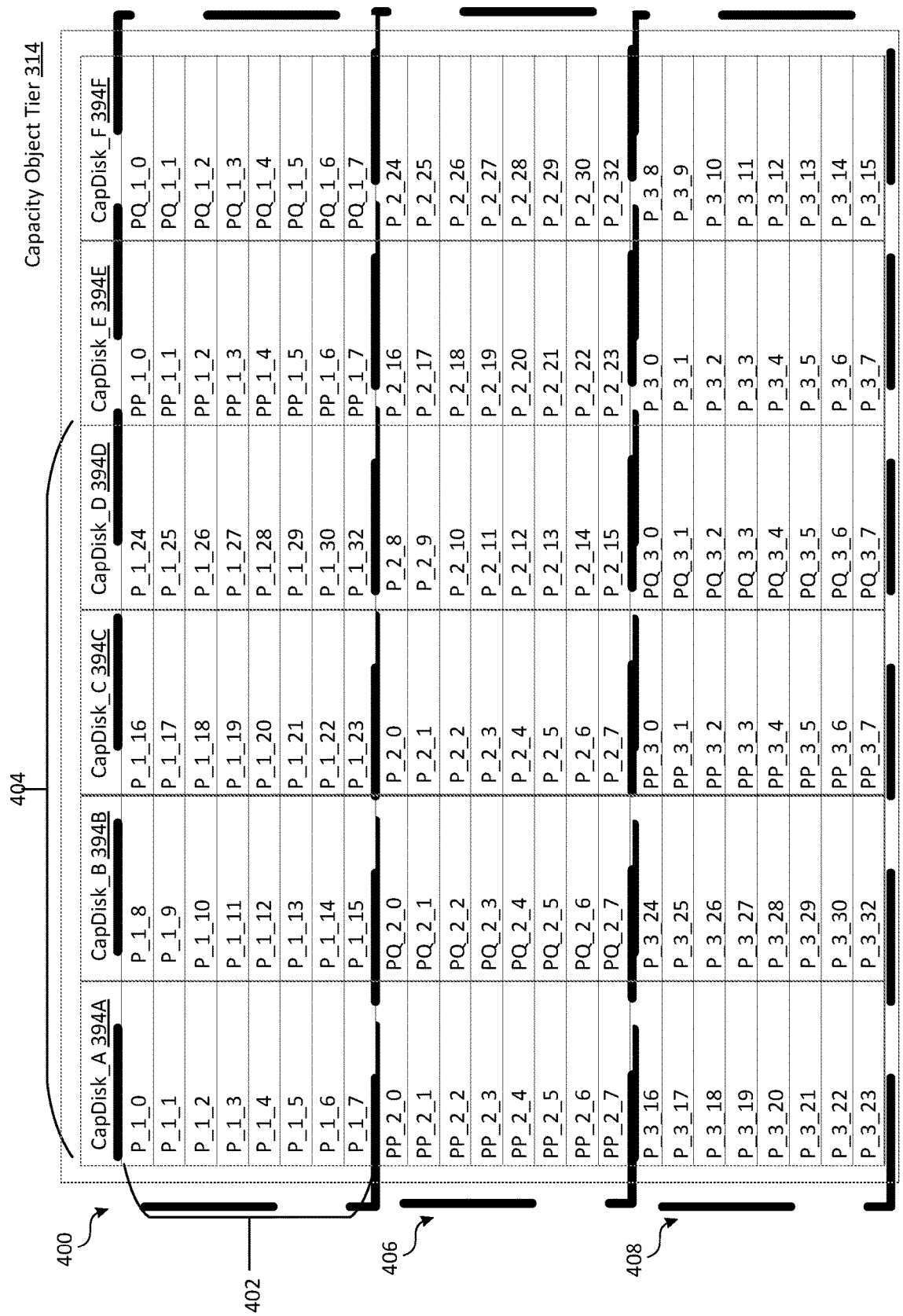
FIG. 4A is a block diagram illustrating an address space for striped erasure coding within the capacity tier of FIG. 3, in accordance with some embodiments.

The capacity tier manages the CapObj via an LFS, and thus the storage of the CapObj may be logically treated as being stored (on the capacity storage tier) within a logical log. The CapObj is subdivided into a plurality of 2D stripes. As shown in FIG. 4A, the 2D stripes may be logically (but not physically) arranged on the 2D log of the capacity tier in the logical address space of the CapObj DOM object. Each 2D stripe may be logically (but not physically) arranged as a 2D array with a plurality of horizontal rows and vertical columns that form a 2D array of cells in the logical address space of the CapObj DOM object. Each cell of any particular 2D stripe may represent a logical address for one data block within the particular 2D stripe (within the CapObj). The cells within a vertical column represents blocks of data written to a single (virtual or physical) disk within the RAID arrangement of capacity tier. The cells within a horizontal row may represent blocks of data within the 2D stripe distributed across the multiple (virtual or physical) disks of the RAID arrangement of the capacity tier.

A horizontal row within a stripe may be referred to as a 1D stripe. The client data within a 1D stripe is distributed across a portion of the RAID disks. The parity data for the client data is calculated and stored in the 1D stripe and in the remaining portion of the RAID disks. In an example directed towards 4+2 RAID 6 embodiments, four blocks of client data and two blocks of corresponding parity data may be written to a 1D stripe. Each of the four client data blocks may be written to one of four of the six disks and each of the two parity data blocks may be written to one of the two remaining disks of the six disks. The storing of the client data and corresponding parity data may be indicated by the following 1D array, or n-tuple: (D_1, D_2, D_3, D_4, P, Q). Each entry in the n-tuple corresponds to one of the six disks, D_1, D_2, D_3, and D_4 each refer to a client data block, and P and Q refer to the two parity data blocks for the four client data blocks.

Figure 4B:
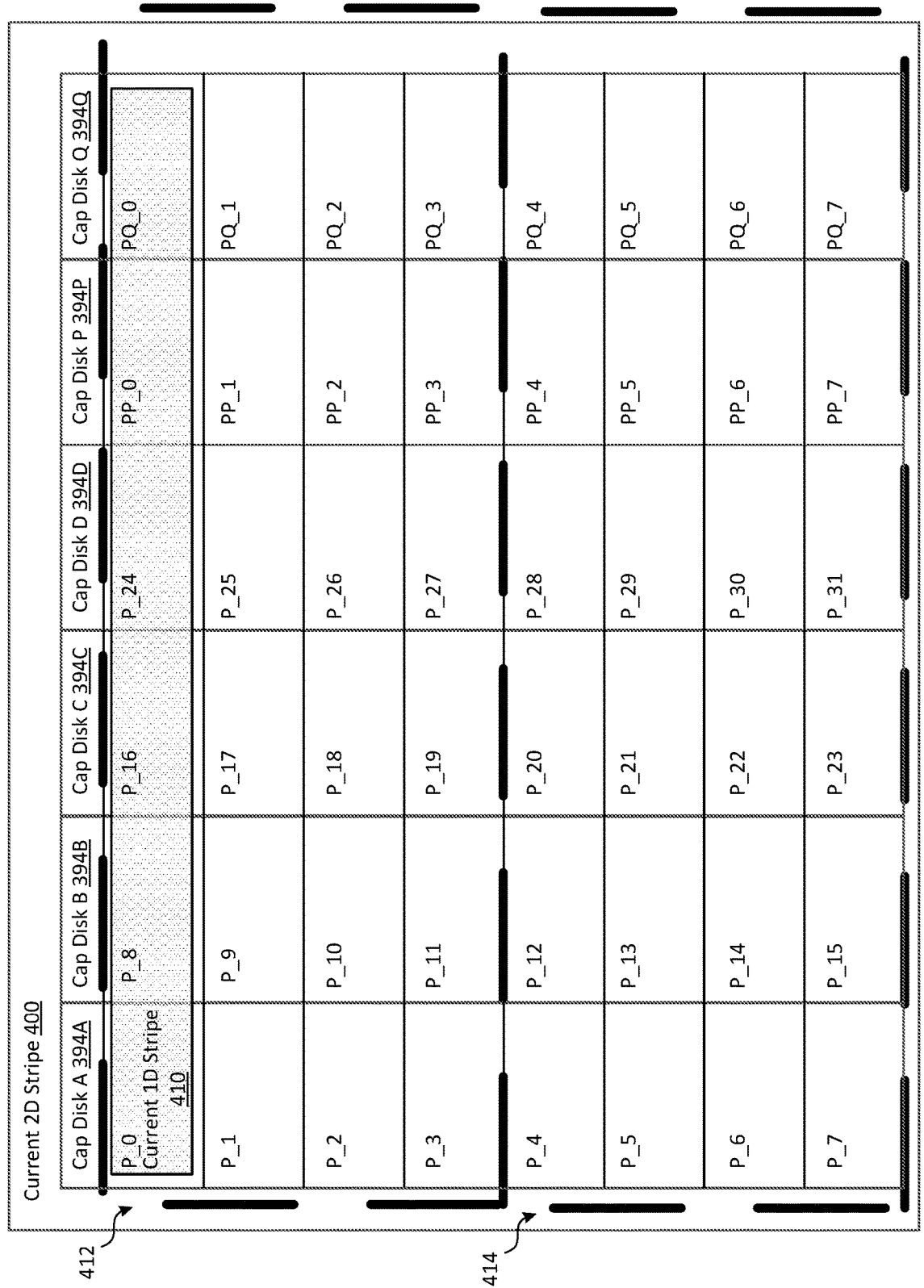
FIG. 4B is a block diagram illustrating segments of the 2D stripe of FIG. 4A, in accordance with some embodiments.
Figure 7:
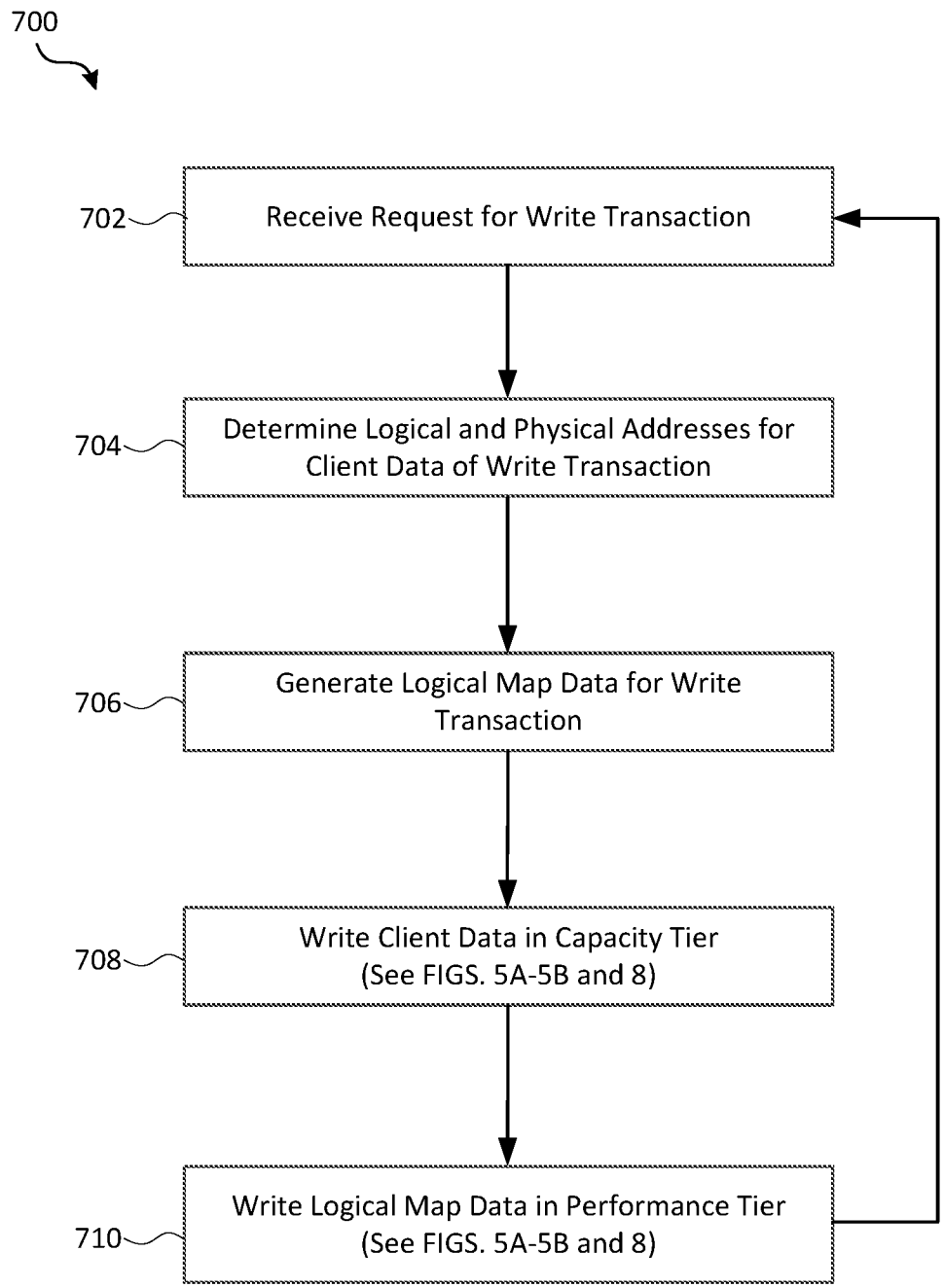
FIGS. 7-11 illustrate flowcharts of exemplary methods for managing client data in a distributed-computing system, in accordance with some embodiments.

As shown in FIG. 4B, each 2D stripe of the CapObj may include one or more 2D segments, where the one or more segments are logically stacked in a vertical fashion in the 2D stripe. A conventional LFS sequentially writes data to the head of the log of the capacity tier, where the head sequentially advances from segment to the next free segment (and from 2D stripe to 2D stripe) along the log as data is written to the capacity tier. In the embodiments discussed herein, data is sequentially written to the current segment of the current 2D stripe, where the current 2D stripe and the current segment of the current 2D stripe sequentially advances to the next free segment of the capacity tier. Thus, when a pre-existing data block in the CapObj is updated and/or modified, the pre-existing data block is not overwritten (eliminating the need for a seek operation), but rather the modified and/or updated version of the data block is written to the current segment of the current stripe. In non-limiting embodiments, a data block (or simply a block) may store 16 KB of data. In other embodiments, a data block may be sized differently. For example, a block of data may be 4 KB, 8 KB, 32 KB, 64 KB, 128 KB, 512 KB, 1 MB, or the like.

In the various embodiments, the stripe size may refer to the number of cells within a vertical column of a 2D stripe, and thus may refer to the maximum number of consecutive blocks that may be written to a single disk within the RAID arrangement. The segment size may be the number of cells within a vertical column of the segment, and thus may refer to the maximum number of consecutive blocks that may be written to a single disk within the segment. The stripe width may refer to the number of disks that payload (or client) data (not including the parity data) is written to in a 2D stripe. In one non-limiting (but exemplary) embodiment, the capacity tier may include a 4+2 RAID 6 arrangement, with six disks. As noted above, within a 2D stripe, four of the six disks may store non-parity (e.g., payload) data and the other two disks may store parity data. The stripe width in such embodiments is four. In such an embodiment, a 2D stripe may store 6*8=48 blocks of data, where 4*8=32 blocks are non-parity data blocks and 2*8=16 blocks are parity data blocks. In some embodiments, the stripe size may be eight blocks. Thus, in embodiments where the block size is 16 KB, a 2D stripe may store 48*16 KB=768 KB of data, where 32*16 KB=512 KB of the data includes non-parity data (e.g., client or payload data) and 16*16 KB=256 KB of the data includes parity data. A 2D stripe may include two segments. In such embodiments, the segment size may be four. Note that these sizes and widths are non-limiting, and the embodiments may vary in any of the sizing of 2D stripes, 1D stripes, and stripe segments.

The MetaObj may include a data object referred to as a memory bank. The memory bank may serve as a cache or storage buffer area to temporarily store data prior to the data being written to the CapObj. In some embodiments, the memory bank of the MetaObj may be subdivided into two memory banks: a logical map data memory bank and a client data memory bank. The client data memory bank may temporarily store (e.g., cache or buffer) client data (e.g., payload and parity data) to be written to a 2D stripe within CapObj. For example, as write requests are received by the vSAN, the client data to be written may be cached in the client data memory bank. The client data memory bank may be referred to as the client memory bank or the client bank. The logical map data memory bank may be referred to as the logical map memory bank or the logical map bank. The logical map memory bank may temporarily store data associated with portions of the logical map data (e.g., leaf nodes and/or Logical Map Pages as described below) to be written to 2D stripes within the CapObj.

In some embodiments, the client memory bank (or simply the client bank) of the MetaObj may be allocated to store one or more 2D stripes. For example, the size of the client bank may be allocated to cache at least two full 2D stripes. In various embodiments, the current segment of the current 2D stripe is cached in the client memory bank. Thus, when writing a stripe to the capacity, read operations from the capacity tier are not required. For example, the memory bank of the fast performance tier may be queried for data (e.g., parity data) associated with writing the stripe. Because the client bank caches client data to be written to capacity tier, the embodiments may concurrently handle write requests for at least N 2D stripes, where N is the number of 2D stripes that the client bank is allocated to store. As noted above, in some embodiments, a 2D stripe may be sized at 768 KB. Thus, a client bank of 2*768 KB=1.5 MB will store two 2D stripes of data. Because the MetaObj is mirrored via the RAID 1 architecture of the performance tier, and all data stored in the memory banks are already logged in the log area of the MetaObj, the client data and the logical map data stored in the corresponding memory banks are recoverable, in the event of one or more disk failures in the performance tier, when at least one disk has not failed.

In the various embodiments, the zDOM may receive a request (e.g., from a client of the vSAN) to write and/or modify payload data. Receiving a write request may initiate or trigger a write transaction in the vSAN. If the amount of payload is enough to fill an entire 2D or 1D stripe (accounting for the corresponding parity data that will be calculated and included in the 2D or 1D stripe), then a full 2D or 1D stripe write transaction may be initiated. Such a full stripe write transaction may include writing the payload data and corresponding parity data to the capacity tier and the corresponding logical map data may be written to the performance tier. For each write transaction (e.g., writing data to the capacity tier), the corresponding logical map data may be generated. In some embodiments, when the payload and parity data is written to the capacity tier, the corresponding logical map data for the transaction is also written to the capacity tier. A unique identifier (e.g., a transaction number or transaction ID) may be generated and assigned to each write transaction. The logical map data for a particular write transaction may be referenced and/or indexed by the corresponding unique write transaction ID. Because the capacity tier is managed by an LFS, regardless of the logical addresses of the client data (e.g., the payload and parity data), the client data may be written to the current 2D stripe of the CapObj. The corresponding logical map data may include the map between the zDOM address and the DOM address for the client data, as well as other metadata, such as but not limited to checksum data for the client data. Thus, the logical map data may be employed to retrieve and/or access the client data, when requested via a client of the vSAN. If the request does not include enough payload data to fill an entire 2D stripe, the client data (along with the corresponding parity data) may be cached in the client bank in the performance tier, until enough payload data is received to write a full (or a partial) 2D stripe. When enough payload data is received, the client data (cached in the client bank), as well as the logical map data, may be written to the capacity tier, via erasure coding.

As write/modify requests are received from a vSAN client, the client data to be written and/or modified may be cached in a memory bank of the performance tier. The current client data, corresponding parity data, and the corresponding logical map data may be stored in a "current stripe" portion of the memory bank. Because the I/O operations of the performance tier are significantly faster than the I/O operations of the capacity tier, caching the data in the performance tier does not create a bottleneck for I/O operations of the vSAN. In some embodiments, the I/O throughput of the performance tier is at least seven times faster than the I/O throughput of the capacity tier. As explained below, when client data is received to be written to the vSAN, the performance tier may be enabled to perform at least seven operations: three operations for 3-way mirroring of the client data, a reading of metadata associated with the current stripe, and a 3-way mirroring of the logical map data associated with the writing of the client data to a stripe. The performance tier may be enabled to perform at least these seven I/O operations in the time that the capacity tier may perform a single I/O operation (e.g., writing a stripe to the capacity tier).

The various embodiments include both full stripe write operational modes and partial stripe write modes. When in a full stripe write mode, one or more full 1D (or 2D) stripes may be written to the current stripe in the capacity tier, employing the data cached in the performance tier. In the above example, $(D\_1, D\_2, D\_3, D\_4, P, Q)$ may be written to the current 1D stripe in the capacity tier. When in a partial stripe write mode, less than a full stripe is written to the current stripe. The current stripe (e.g., the stripe that that partial stripe is to be written to) may be cached in the memory bank of the performance tier. Because the P and Q parity data for the current stripe is cached in the memory bank, when a partial stripe is written to the capacity tier, the corresponding P and Q parity data (as well as the associated client data) may be read from the memory bank, with significantly faster I/O operations than the capacity tier. That is, caching the current segment and the current 2D stripe in the memory bank of the faster performance tier avoids the need to perform read operations for data of the current stripe from the slower capacity tier. Thus, when writing a partial stripe to the capacity tier, the extraneous read operations, which are required by conventional EC systems, are not required by the various embodiments. Switching operational modes between full stripe mode and partial stripe mode may be based on the current number (or rate) of outstanding I/O operations (OIO). When the number of OIO is relatively high, the embodiments may employ a full stripe write mode, whereas when the number OIO is relatively low, the embodiments may employ a partial stripe write mode.

For example, when the OIO count is one and the OIO is a request to write the client data block $D\_1$, four data blocks $(D\_1, LOG, P, Q)$ may be written to the current 1D stripe in the current segment of the capacity tier. LOG is logical map data associated with the write transaction and P/Q are the parity blocks for the current 1D stripe. For example, LOG may include a Logical Map Page associated with the write transaction. That is, the data indicated as LOG may be a leaf node and/or a Logical Map Page data structure, as discussed throughout. In notation used throughout, $LOG\_X$, where X is an integer (or another unique identifier), may refer to the logical map data for a write transaction with the write transaction number or identifier of X. Even though four write operations are required to serve the request to write a single block of client data, there are no read operations required because the other data blocks of the current 1D stripe are cached in the memory. Thus, the updated P and Q data blocks may be calculated without requiring the reads of the other data blocks from the slower capacity tier. When the OIO count is two (e.g., requests to write client data blocks $D\_1$ and $D\_2$), five writes $(D\_1, D\_2, LOG, P, Q)$ and zero reads are required. This is an improvement over conventional EC systems that require six reads and six writes to update the contents of a stripe. When the OIO count is sufficiently high and a full 1D stripe is written, only six writes and zero reads are required, resulting in a write amplification factor of 1.5. This provides a 50% improvement over conventional systems, which have a write amplification factor of 3.0.

As noted above, the logical map data, which included the zDOM map, may be stored and/or managed as a B+tree. The zDOM map includes the mapping between the logical addresses of data blocks within the zDOM object and logical addresses of the equivalent or corresponding data blocks within the DOM object. The address of a particular data block within the zDOM object may be referred to as a zDOM logical address, or simply a zDOM address. The address of the equivalent or corresponding particular data block within the DOM address may be referred to as a DOM logical address, or simply a DOM address. Because the zDOM layer treats the DOM layer as a physical layer of the vSAN, the DOM address may be referred to as a "physical offset," with respect to the zDOM object. Thus, the DOM address may be referred to as a physical address and/or physical offset. The following nomenclature may be adopted when discussing the various embodiments. The zDOM logical address for data block X may be referred to as L_X, where X is an indicator (e.g., an index) that uniquely identifies a data block of the zDOM object. The L in the address L_X indicates that the address is a logical address of the zDOM layer. Because the zDOM layer treats the DOM layer as a physical layer, the corresponding DOM address of the data block (within the DOM object) corresponding to the X data block of zDOM object may be referred to as P_Y, where Y is the corresponding DOM data block. Thus, the zDOM map indicates the correspondence between where L_X and P_Y, e.g., P_90 (i.e., the DOM address) is mapped to and/or corresponds to and L_10 (i.e., the zDOM address), and/or P_90 is the physical offset for L_10. The entry in the zDOM map for L_10 may be indicated at the n-tuple: (P_90).

In some embodiments, at least portions of consecutive DOM data blocks (e.g., data blocks with consecutive and/or contiguous DOM addresses) may correspond to at least portions of consecutive zDOM data blocks (e.g., data blocks with consecutive and/or contiguous logical zDOM addresses). For example, ten consecutive blocks of the DOM object may be mapped to ten consecutive blocks of the zDOM object. In the above example, L_10 may correspond to P_90, L_11 may correspond to P_91, L_12 may correspond to P_92, up to L_19 corresponds to P_99. The number of consecutive blocks (e.g., the consecutive block width of the zDOM) may be stored in the zDOM map, and may be referred to as N_Z, where Z is an integer that indicates the number of consecutive blocks. In the above example, N_Z=N_10. The entry in the zDOM map for L_10 may be indicated at the n-tuple: (P_90, N_10). Note that for such embodiments, entries for L_11, L_12, . . . , L_19 are not required in the zDOM map.

In some embodiments, for each data block of the ZDOM object, checksum data may be calculated and stored in the logical map data. The checksum data for a particular block may enable error detection and/or corruption detection of the data within the particular block. The checksum data for each block may be stored within the zDOM map. In various embodiments, the checksum data may be calculated via a Cyclic Redundancy Check (CRC) algorithm. In such embodiments, checksum data for L_X may be indicated as CRC_X. In the above example, the entry in the zDOM map for L_10 may be indicated at the n-tuple: (P_90, N_10, CRC_10, CRC_11, . . . , CRC_19).

As with many B+trees, most of the data included in the logical map data is encoded in the leaf nodes (or leaf pages) of the structured data. The non-leaf nodes may be referred to as index nodes or index pages because they include pointers to the leaf pages. In various embodiments, a leaf page may structure the logical map data via key-value pairs. The key may include a zDOM address. The corresponding value for the key may include an n-tuple (or other data structure) that indicates the zDOM mapping. Thus, in the above example of consecutive blocks, a leaf page corresponding to L_10 may store the key: L_10 and the corresponding value for the key to the n-tuple is: (P_90, N_10, CRC_10, CRC_11, . . . , CRC_19). Note that leaf pages corresponding to L_11-L_19 are not required in the logical map data because the leaf page for L_10 includes the logical map data for L_11-L_19. Thus, the key value pair stored in a leaf page corresponding to L_10 may include the key-value pair of: key=L_10 and value=: (P_90, N_10, CRC_10, CRC_11, . . . , CRC_19).

As noted above, a leaf node may be referred to as a Logical Map Page. In some embodiments, a Logical Map Page includes the structured data (e.g., the key-value pair) for a data block of the zDOM object. A Logical Map Page may be structured to include up to 512 B of data encoding the key-value pair of the logical map data for a particular data block of the zDOM object. An index page, which may be stored in the Logical Map Tree, for a particular Logical Map Page, may include a pointer that points to the particular Logical Map Page. The index page may be significantly smaller than the leaf page. In some embodiments, the index page is 1/256 the size of the corresponding leaf page.

In the various embodiments, the Logical Map Tree may be stored in the performance tier. Each index page in the Logical Map tree may be 24 B. The size of the Logical Map Tree (which includes pointers to each Logical Map Page) for the zDOM object may be 864 GB and thus may easily fit on the performance tier. When a write request is received by the zDOM, the Logical Map Page corresponding to the data block to be written is cached in the logical map memory bank. The Logical Map Page data structure may be indicated as LOG throughout. One or more index pages within the Logical Map Tree are updated to include a pointer to the corresponding Logical Map Page. After a sufficient number of Logical Map Pages have been generated, modified, and/or updated in the log memory bank, those Logical Map Pages may be migrated to the CapObj. Such a migration of the Logical Map Pages to the capacity tier may free-up space in the performance tier. In response to such a migration, the pointers in the Logical Map Tree may be updated to point to the address of the Logical Map Pages in the CapObj. Allocating 512 B for a Logical Map Page may be advantageous because a 4 KB data block may be compressed into integer multiples of 512 B. When a Logical Map Page is written to the capacity tier, the Logical Map Page may be written to a data block without increasing the complexity of the LFS file system of the capacity tier. In a small data write operation (e.g., writing a single block of client data to a 1D stripe), writing the client data may include writing a 512 B Logical Map Page to the capacity tier, resulting in a write amplification factor of 1.25. When in partial stripe write mode, the Logical Map Page for the transaction may be written directly to the current stripe in the capacity tier as described throughout.

In the hierarchy of layers, the DOM layer may be between the zDOM and LSOM layers. The zDOM is the top layer in the hierarchy and the LSOM layer is the lower layer in the hierarchy. The logical map data discussed so far includes a mapping between the zDOM and DOM addresses. That is, the logical map data encodes (e.g., in a B-Tree) a translation between the zDOM address (e.g., the zDOM logical offset) and the DOM address (e.g., the DOM physical block offset). In some embodiments, DOM address can be translated to the LSOM component id and offset using simple arithmetic with the stripe width and stripe size. In some embodiments, there may exist another address map that maps the LSOM component id and component offset to the LSOM address (e.g., the LSOM offset) of the LSOM layer. For the discussion here, the terms zDOM logical map data and LSOM logical map data may be employed to distinguish between the two mappings. Note that the terms DOM logical map data and LSOM logical map data may be employed interchangeably, and are distinguishable from zDOM logical map data. The zDOM logical map data encodes the translation between the zDOM and DOM addresses, while the LSOM logical map data encodes the translation between the DOM and LSOM addresses. Similar to the zDOM logical map data, the LSOM logical map data may be encoded in a B-Tree, stored on disks. Thus, the terms zDOM B-Tree and DOM B-Tree may be employed to distinguish between the two data structures storing mapping data.

The entries for the LSOM logical map may be determined when data is written, in the LSOM layer. Thus, as data is written, modified, and/or updated, in the capacity tier, as discussed throughout, entries in the LSOM logical map data may be generated and encoded in the DOM B-Tree. As discussed above, each write transaction may associated with a transaction ID. Thus, each write transaction at the LSOM layer may generate an LSOM transaction ID. Thus, each LSOM transaction ID may be associated with an LSOM address that stores the data written during the write transaction. The LSOM address (e.g., the LSOM disk offset) and the LSOM transaction may be encoded in the LSOM logical map data. The LSOM layer may be structured around an LFS and employ a segment usage table (SUT) to encode various information about the segments written to the LSOM, such as but not limited to the LSOM transaction ID. The SUT may be structured as a lookup table. Because the SUT is relatively small, the SUT may be cached in high speed memory. When the "locality" of the data in the LSOM is adequate (e.g., the current data is not too segmented in the LSOM), the SUT may be employed for fast look-up operations to determine the LSOM address. However, to determine both the DOM address, the zDOM B-Tree (stored on disk) may be consulted and to determine LSOM address, the DOM B-Tree (stored on disk) may be consulted based on the DOM address. As described below, in some embodiments, the access to the DOM B-Tree may be avoided by the inclusion of the LSOM address and the LSOM transaction ID in the zDOM B-Tree. Looking up the LSOM address via the DOM B-Tree may be a relatively slow operation because of the requirement to access data written to a disk. As described below, rather than accessing data from two separate (relatively slow) B-Trees, the various embodiments may access a single B-Tree (e.g., the zDOM B-Tree) and perform a relatively fast lookup via the SUT. The lookup in the SUT is relatively fast because the SUT is small enough to cache in relatively fast RAM.

The LSOM transaction ID may be referred to as a generation ID because it indicates a generation of write operations for the segments of the LFS of the LSOM layer. In some embodiments, segment cleaning (e.g., "garbage collection") operations may be routinely and/or periodically performed on the segments of the LSOM. Various embodiments of segment cleaning and/or garbage collection are discussed below. However, briefly here, segment cleaning (or garbage collection) may include re-allocating (or cleaning and/or freeing up) live data blocks that are written in "dirty" segments, at the LSOM layer, as well as re-writing data to other LSOM address. Thus, segment cleaning (or garbage collection) at the LSOM layer results in write operations that may change the LSOM address associated with data blocks. The write operations during segment cleaning at the LSOM may result in an updated LSOM address and an associated new LSOM transaction ID (or generation ID).

Whether a particular generation ID is still valid (e.g., current), or has become "stale," "outdated," and/or "expired" due to write operations at the LSOM layer, may be encoded in the SUT. The SUT may include an entry for each LSOM transaction ID (e.g., a generation ID) for each write operation at the LSOM layer. The encoded record for a particular generation ID may indicate whether the generation ID is "valid" (or "current), or whether the generation ID has become "stale" or "outdated" due to write operations (e.g., segment cleaning). A valid (or current) generation ID is one where the associated data is current and still located at the LSOM address associated with the generation ID. A stale, outdated, and/or expired generation ID is one where the associated data has been modified and/or is stored at a LSOM address that is different from the LSOM address associated with the generation ID.

The zDOM layer may receive a write request. The write request may be serviced via the various embodiments discussed herein (e.g., see discussions in conjunctions with at least FIGS. 5A-5B and 7-9). The zDOM to DOM mapping associated with the write request may be encoded in the logical map data. When the data is written at the LSOM layer, the LSOM layer may return the LSOM transaction ID, as well as the LSOM address associated with the write transaction. The LSOM address and the LSOM transaction ID may be written to the zDOM logical map data, as part of the B-Tree data structure of the zDOM to DOM map. For example, for a particular write transactions, in addition to the DOM address, the LSOM address and the associated generation ID may be written to the associated leaf in the zDOM B-Tree. As described below, for future retrieval of the data, the encoding of the LSOM address (e.g., the LSOM disk offset) and the generation ID in the zDOM logical map data may save significant readings (from disk) of the DOM B-Tree.

A read request may be received at the zDOM layer, which includes an associated zDOM address to read data from. The zDOM logical map data (encoded in the zDOM B-Tree) may be employed to look up the corresponding DOM address. A corresponding LSOM address and generation ID may be retrieved from the zDOM B-Tree. The zDOM layer may provide the DOM layer with the DOM address, as well as the LSOM address and the generation ID. The DOM layer may provide the LSOM layer with the corresponding LSOM address and the generation ID. The SUT, which is cached in fast RAM may be consulted to determine if the generation ID is valid and/or current. If, according to the fast SUT, the provided LSOM address is current, and thus a lookup in the DOM B-Tree (which is stored on disk) is not required. Thus, storing the LSOM address and the corresponding generation ID in the zDOM B-Tree may avoid many read operations from the DOM B-Tree, greatly increasing the efficiency of the vSAN. If the generation ID is stale, outdated, and/or expired, the DOM B-Tree may be consulted to determine the LSOM address. However, based on the rate of "garbage accumulation" in the LSOM, many readings of the DOM B-Tree may be avoided because many of the generation IDs stay current for a significant amount of time. In embodiments where the DOM B-Tree is consulted because the generation ID stored in the zDOM B-Tree is expired, the zDOM B-Tree (and thus the zDOM logical map data) may be updated to encode the updated LSOM address and the updated generation ID. Thus, for future data retrievals, the DOM B-Tree need not be consulted to determine the LSOM address.

As discussed throughout, an LFS may be employed in the various embodiments. For example, the capacity tier is managed by an LFS. Thus, segment cleaning and/or garbage collection operations may be performed periodically (or from time to time). For example, segment cleaning may be performed via a predetermined frequency, during times of low system utilization, as a routine maintenance operation, or as otherwise required (e.g., when no "clean" segments are available). As noted throughout, the capacity tier storage may be subdivided into a plurality of segments, only one of which is the "active" or current segment at any given moment. A segment may be a "dirty" segment if it is not the current segment and contains one or more blocks of "live" (or unexpired) client data. A live data block may be a block of client data, for which no "newer," updated, or otherwise modified version of the data block (that supersedes a previous version of the data block) is written to another portion of the storage. In contrast, an "expired," "stale," or "invalid" data block is a data block, where the underlying data has been updated, modified, or otherwise edited, and the "modified" version of the data block has been written to another portion of the storage. Thus, the relevancy (e.g., to the client) of the "expired" version of the data block may have been superseded by the "live" version of the data block. Thus, a dirty segment is a segment that is not the current segment, but contains client data or information that the system needs to preserve, conserve, or otherwise make available for future access. A "clean" segment is a segment that is not a dirty segment. Segment cleaning or garbage collection operations are operations that transform dirty segments into clean segments. In so doing, segment cleaning operations may copy live data from dirty segments to the current segment, while not copying any expired data blocks from the dirty segment. Accordingly, segment cleaning may result in changing the LSOM address of blocks of client data, as well as the parity data associated with the blocks of data.

Thus, segment cleaning may include reading large segments of data at the LSOM layer, and re-writing those segments to new LSOM addresses. It is understood that in the various embodiments, the segment cleaning operations may include updating the SUT to indicate the updating of the LSOM addresses for live data blocks. For example, when a live data block is re-mapped or local copied, a previous LSOM transaction ID associated with the data block may be marked "expired" in the SUT. A new LSOM transaction ID resulting from the re-mapping or local copying of the data block may be entered into the SUT and marked as valid. In some non-limiting embodiments, the new LSOM transaction ID and the associated updated LSOM address may be sent to the zDOM. The zDOM may, in some embodiments, update the zDOM logical map data to indicate the updated LSOM transaction ID and associated updated LSOM address for the data block.

In some embodiments, the DOM layer may be generally responsible for managing, or otherwise orchestrating, segment cleaning operations. As discussed below, in conventional systems, segment cleaning may require the transfer of large amounts of data between the LSOM and DOM layers. Note that in some embodiments, this data transfer may require transferring data over networked resources. Some embodiments decrease the amount of data transfer required for segment cleaning via remapping methods or local data copying methods.

In a segment cleaning operation, the DOM layer may issue a command to read live data blocks from one or more dirty segments, from LSOM layer, that are to be cleaned. Upon reading the data blocks, the live blocks may be transferred (or transmitted) from the LSOM layer to the DOM layer, where the transferred live blocks may be re-written at updated LSOM addresses. Because the live blocks are re-structured into stripes in the current segment, new or updated parity data for the live blocks as they are structured into new stripes. The new or updated parity data may be calculated at the DOM layer. In conventional systems, before being re-written, the live data (being cleaned), as well as the associated parity data, may be transferred from the DOM and back to the LSOM layer. The LSOM layer may manage re-writing the transferred live data, as well as the parity data into the current segment, with updated LSOM addresses.

An example of a segment cleaning operation, in the context of a conventional 4+2 RAID 6 arrangement is now discussed. In this non-limiting example, a request to clean 400 live blocks of data from a dirty segment may be issued by the DOM. On average, there are about 100 blocks of live data, in each of the four data disks (of the 4+2 RAID 6 arrangement) to be cleaned. In conventional systems, this would require 400 blocks of data to be read at the LSOM and transferred to the DOM. Conventional systems would then require 600 blocks of data (the 400 data blocks of cleaned data and the 200 associated parity blocks) to be transferred from the DOM to the LSOM, to be written at the LSOM layer. Thus, to clean 400 blocks of data at the LSOM layer, conventional systems may require the transfer of 1000 blocks of data across network resources, as well as 400 read operations and 600 write operations.

The various embodiments may decrease the amount of data required to be transferred across network resources in such segment cleaning operations. In some embodiments, a remapping method may be employed, during segment cleaning and/or garbage collection operations. Re-mapping embodiments employ the LSOM layer (which originally read the live data blocks that were transferred to the DOM) to re-map (or otherwise update) the LSOM addresses associated with the live data blocks. The re-mapped LSOM addresses may be LSOM addresses associated with the current segment. Thus, in re-mapping embodiments, the DOM layer does not need to transfer the live data blocks back to the LSOM layer. Accordingly, re-mapping embodiments reduce the amount of block transfers between the LSOM and DOM layers. In other embodiments, a local copy method may be employed, during segment cleaning and/or garbage collection operations. Local copy embodiments employ the LSOM layer make a local copy of the live blocks in the current segment. Thus, in local copy embodiments, the DOM layer does not need to transfer the live data blocks back to the LSOM layer. Accordingly, local copy embodiments reduce the amount of block transfers between the LSOM and DOM layers.

In some embodiments, the LSOM layer may include a cleaning agent (or cleaning process) that performs various elements of the segment cleaning operations. For example, the cleaning agent of the LSOM may perform the remapping and/or local copying operations of the various embodiments. The remapping and local copy embodiments may employ a two-phase commit protocol to ensure the re-mapping or local copying of the "cleaned" live blocks. Briefly, two-phase commit protocols may be employed when implementing a distributed algorithm. In two-phase commit protocols, there may be a coordinating process (e.g., a coordinating agent and/or party) and one or more participating processes (e.g., a participating agent and/or party). In the various embodiments, the DOM may implement the coordinating process, and each of the disks at the LSOM layer (e.g., the six disks of the 4+2 RAID 6 arrangement) may implement a separate participating process. In some embodiments, the LSOM layer may implement a single participating process that manages, or otherwise orchestrates, the re-mapping or local copying operations of each of the separate disks.

The first of the two phases of a two-phase commit protocol may be a commit-request phase and the second phase may be a commit phase. In the commit-request phase, the coordinating process (e.g., implemented by the DOM layer), may request operations (e.g., receive parity data and re-map or local copy the live blocks being cleaned) to each of the participating processes. For example, the DOM layer may issue a request (e.g., a remapping request or a local-copying request) to each of the disks of the LSOM. In some embodiments, the request operation may be sent to the cleaning agent of the LSOM layer. The cleaning agent may relay the request to each of the disks. In other embodiments, the DOM may send the request to each of the disks directly. The DOM may receive from each of the disks, a "yes" or "no" signal, indicating whether the disk is in a state to comply with the DOM's request. That is, the coordinating process receives a "vote" from each of the participating processes, where the vote indicates whether the voting agent may service the request from the coordinating agent. In the second phase (e.g., the commit phase) of the protocol, the coordinating agent (implemented by the DOM layer) may tally the participating votes. If each of the participating agents (e.g., each of the distributed storage disks) may comply with the request, the DOM may send a commit signal to the LSOM, indicating each of the participating agents to commit (e.g., execute) to the requested service or operation. If at least a portion of the participating agents is not in a state to commit to the requested service, the DOM may send an abort or terminate signal to the LSOM, indicating the disks to abort the transaction.

Returning to the above example of a 400 block garbage collection operation, the DOM may issue a request to the LSOM to read and transfer the 400 data blocks (to be cleaned) to the DOM. After the 400 blocks of data has been received, the DOM may calculate the corresponding 200 blocks of parity data. In some embodiments, whether the live data blocks being cleaned are to be re-mapped at the LSOM, or local copied at the LSOM, the DOM may determine, identify, or otherwise generate the new or updated LSOM addresses for the live blocks. In other embodiments, the LSOM layer may determine the updated LSOM addresses for the live blocks. In the remapping embodiments, the DOM may initiate a two-phase commit protocol (e.g., a distributed transaction) for remapping the 400 data blocks. The request may, sent from the DOM to the LSOM, may request the receiving of the 200 blocks of parity data, as well as remapping the 400 blocks of data in the LSOM. In some embodiments, the commit-request may additionally include receiving the updated LSOM address (as determined by the DOM), or for the updated LSOM addresses to be determined at the LSOM layer. Upon receiving a commit vote from the participating processes, the DOM may transmit the parity blocks to the LSOM and issue the commit signal to commence re-mapping or performing a local copy of the live blocks being cleaned. In the embodiments where the DOM determined the updated LSOM addresses for the live blocks being cleaned, the corresponding updated LSOM addresses may be transmitted from the DOM to the LSOM.

In the above example, and in contrast to conventional systems, the 400 live blocks being cleaned need not be transmitted from the DOM to the LSOM, because the LSOM originally read at the 400 blocks. Thus, the LSOM may re-map or generate a local copy of the live blocks without them being transmitted back to the LSOM. Thus, whether re-mapped or local copied, the segment cleaning embodiments only need to transfer 600 blocks (400 blocks of live data from the LSOM to the DOM and 200 parity blocks from the DOM to the LSOM), rather than the 1000 blocks of transferred data required by conventional systems. Thus, the segment cleaning embodiments provide significant enhancements to efficiency and performance over such conventional systems.

Figure 1A:
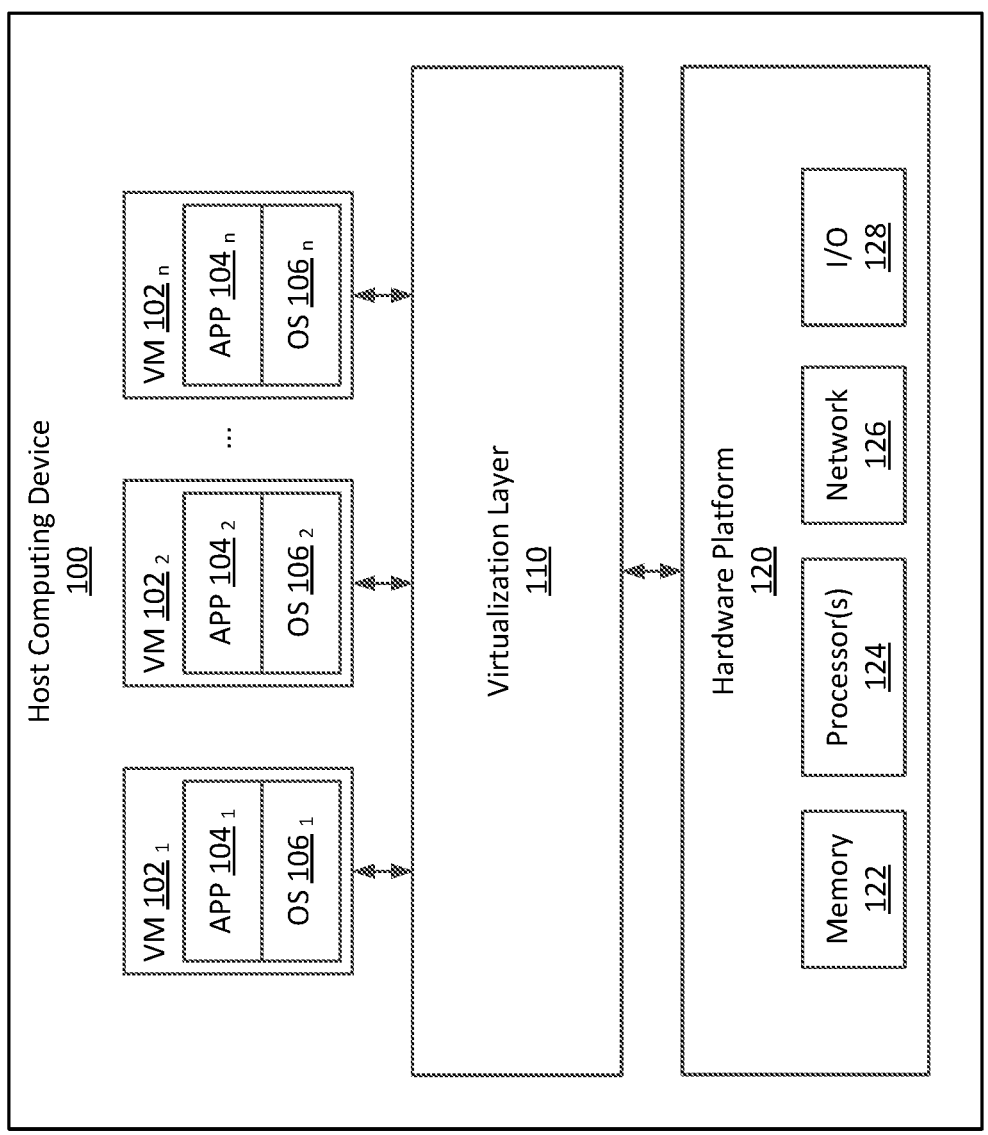
FIG. 1A is a block diagram illustrating a system and environment for implementing various components of a distributed-computing system, in accordance with some embodiments.

FIG. 1A is a block diagram illustrating a system and environment for implementing various components of a distributed-computing system, according to some embodiments. As shown in FIG. 1, virtual machines (VMs) $102_1$, $102_2 \ldots 120_n$ are instantiated on host computing device 100. In some embodiments, host computing device 100 implements one or more elements of a distributed-computing system (e.g., storage nodes of a vSAN 200 described with reference to FIG. 2). Hardware platform 120 includes memory 122, one or more processors 124, network interface 126, and various I/O devices 128. Memory 122 includes computer-readable storage medium. The computer-readable storage medium is, for example, tangible and non-transitory. For example, memory 122 includes high-speed random access memory and also includes non-volatile memory, such as one or more magnetic disk storage devices, flash memory devices, or other non-volatile solid-state memory devices. In some embodiments, the computer-readable storage medium of memory 122 stores instructions for performing the methods and processes described herein. In some embodiments, hardware platform 120 also includes other components, including power supplies, internal communications links and busses, peripheral devices, controllers, and many other components.

Virtualization layer 110 is installed on top of hardware platform 120. Virtualization layer 110, also referred to as a hypervisor, is a software layer that provides an execution environment within which multiple VMs 102 are concurrently instantiated and executed. The execution environment of each VM 102 includes virtualized components analogous to those comprising hardware platform 120 (e.g. a virtualized processor(s), virtualized memory, etc.). In this manner, virtualization layer 110 abstracts VMs 102 from physical hardware while enabling VMs 102 to share the physical resources of hardware platform 120. As a result of this abstraction, each VM 102 operates as though it has its own dedicated computing resources.

Each VM 102 includes operating system (OS) 106, also referred to as a guest operating system, and one or more applications (Apps) 104 running on or within OS 106. OS 106 (e.g., Darwin, RTXC, LINUX, UNIX, OS X, iOS, WINDOWS, or an embedded operating system such as VxWorks) includes various software components and/or drivers for controlling and managing general system tasks (e.g., memory management, storage device control, power management, etc.) and facilitates communication between various hardware and software components. As in a traditional computing environment, OS 106 provides the interface between Apps 104 (i.e. programs containing software code) and the hardware resources used to execute or run applications. However, in this case the "hardware" is virtualized or emulated by virtualization layer 110. Consequently, Apps 104 generally operate as though they are in a traditional computing environment. That is, from the perspective of Apps 104, OS 106 appears to have access to dedicated hardware analogous to components of hardware platform 120.

FIG. 1B is a block diagram illustrating a containerized application framework for implementing various components of a distributed-computing system, in accordance with some embodiments. More specifically, FIG. 1B illustrates VM $102_1$ implementing a containerized application framework. Containerization provides an additional level of abstraction for applications by packaging a runtime environment with each individual application. Container 132 includes App 104₁ (i.e., application code), as well as all the dependencies, libraries, binaries, and configuration files needed to run App 104₁. Container engine 136, similar to virtualization layer 110 discussed above, abstracts App 104₁ from OS 106₁, while enabling other applications (e.g., App 104₂) to share operating system resources (e.g., the operating system kernel). As a result of this abstraction, each App 104 runs the same regardless of the environment (e.g., as though it has its own dedicated operating system). In some embodiments, a container (e.g., container 132 or 134) can include a gateway application or process, as well as all the dependencies, libraries, binaries, and configuration files needed to run the gateway applications.

It should be appreciated that applications (Apps) implementing aspects of the present disclosure are, in some embodiments, implemented as applications running within traditional computing environments (e.g., applications run on an operating system with dedicated physical hardware), virtualized computing environments (e.g., applications run on a guest operating system on virtualized hardware), containerized environments (e.g., applications packaged with dependencies and run within their own runtime environment), distributed-computing environments (e.g., applications run on or across multiple physical hosts) or any combination thereof. Furthermore, while specific implementations of virtualization and containerization are discussed, it should be recognized that other implementations of virtualization and containers can be used without departing from the scope of the various described embodiments.

Figure 2:
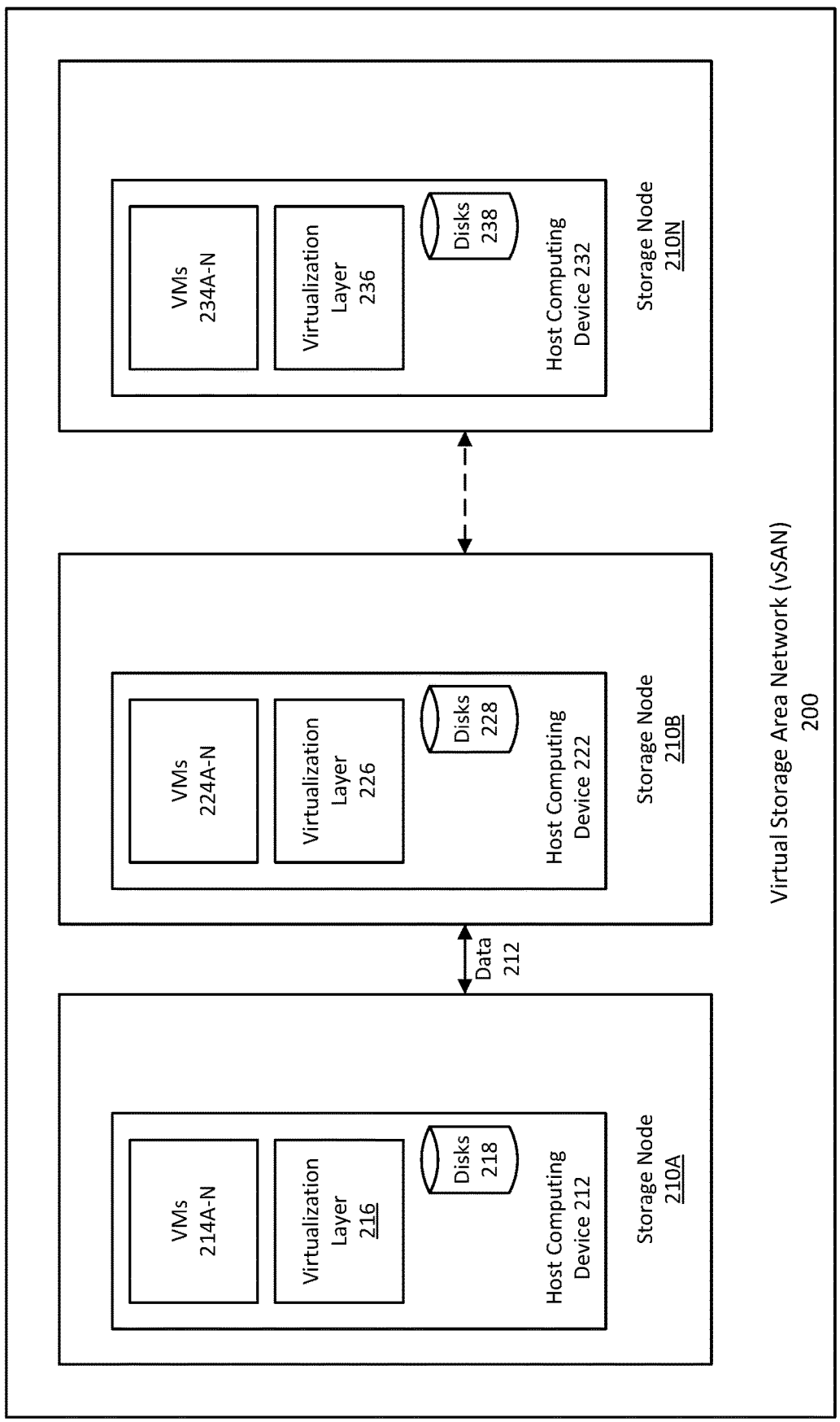
FIG. 2 is a block diagram illustrating a virtual storage area network (vSAN), in accordance with some embodiments.

FIG. 2 is a block diagram illustrating a virtual storage area network (vSAN) 200, in accordance with some embodiments. As described above, a vSAN is a logical partitioning of a physical storage area network. A vSAN divides and allocates a portion of or an entire physical storage area network into one or more logical storage area networks, thereby enabling the user to build a virtual storage pool. As noted throughout, a vSAN may implement any of the various embodiments discussed herein. As illustrated in FIG. 2, vSAN 200 can include a cluster of storage nodes 210A-N, which can be an exemplary virtual storage pool. In some embodiments, each node of the cluster of storage nodes 210A-N can include a host computing device. FIG. 2 illustrates that storage node 210A includes a host computing device 212; storage node 210B includes a host computing device 222; and so forth. In some embodiments, the host computing devices (e.g., devices 212, 222, 232) can be implemented using host computing device 100 described above. For example, as shown in FIG. 2, similar to those described above, host computing device 212 operating in storage node 210A can include a virtualization layer 216 and one or more virtual machines 214A-N (collectively as VMs 214). In addition, host computing device 212 can also include one or more disks 218 (e.g., physical disks) or disk groups. In some embodiments, VM 214 can have access to one or more physical disks 218 or disk groups via virtualization layer 216 (e.g., a hypervisor). In the description of this application, a storage node is sometimes also referred to as a host computing device.

The disks in a vSAN (e.g., disks 218/228/238) may be employed as the storage disks in the various embodiments. As such, the disks in vSAN 200 may be configured in various RAID configurations. Furthermore, the disks in vSAN 200 may be employed in the performance and capacity tiers as discussed throughout. In some embodiments, the disks employed of vSAN 200 may include a solid-state disk (SSD) or NVMe device based on one or more non-volatile random access memory (NVRAM) technologies (e.g., FLASH, EEPROM, or the like). The memory technologies employed in the embodiments may include the ability to store more than one bit in a cell. That is, the storage cells may be multi-level cells (MLCs). In some embodiments, each cell of the memory devices may store 2 bits (two-level cells), 3 bits (tri-level cells), 4 bits (quad-level cells), or even a larger number of bits (e.g., 5 bits per cell or penta-level cells). For example, an SSD employed in the embodiments may include multi-level, tri-level, or quad-level FLASH devices. Although, the embodiments are not limited, and the embodiments may employ more conventional magnetic disks (e.g., hard disks with spinning magnetic material and read/write heads). As discussed throughout, in some embodiments, a storage disk may be a virtualized storage disk.

Figure 3:
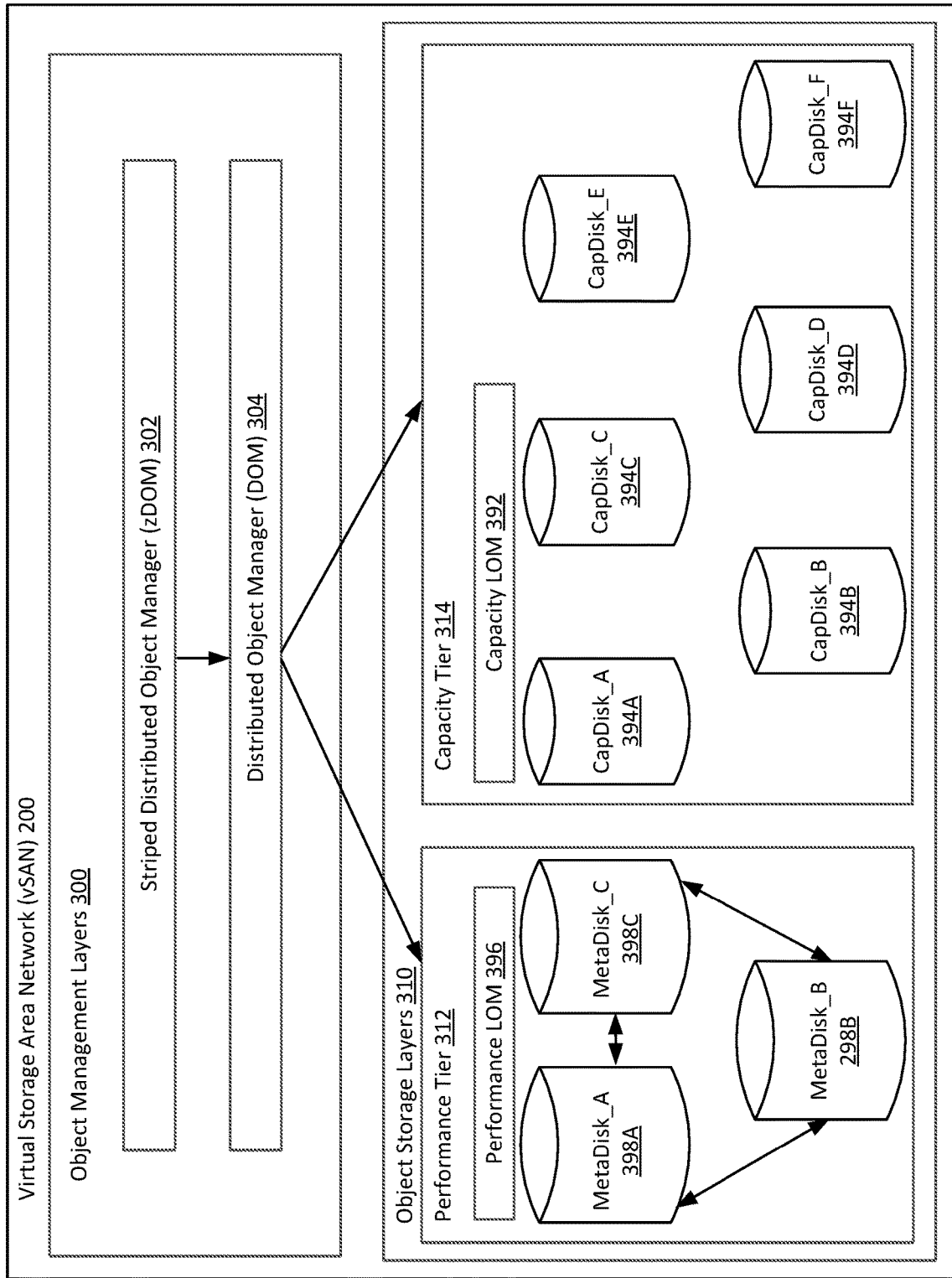
FIG. 3 is a block diagram illustrating logical hierarchal layers in the vSAN of FIG. 2, in accordance with some embodiments.

As illustrated in FIG. 2, data can be communicated among storage nodes 210A-N in vSAN 200. One or more storage nodes 210A-N can also be logically grouped or partitioned to form one or more virtual storage pools such as clusters of storage nodes. The grouping or partitioning of the storage nodes can be based on pre-configured data storage policies such as fault tolerance policies. For example, a fault tolerance policy (e.g., a redundant array of independent disks policy or a RAID policy) may require that multiple duplicates of a same data component be stored in different storage nodes (e.g., nodes 210A and 210B) such that data would not be lost because of a failure of one storage node containing one duplicate of the data component. Such a policy thus provides fault tolerance using data redundancy. In the above example, each duplicate of the entire data component can be stored in one storage node (e.g., node 210A or node 210B). As described in more detail below, in some embodiments, multiple subcomponents of a data component or duplicates thereof can be stored in multiple storage nodes using dynamic partitioning techniques, while still in compliance with the fault tolerance policy to provide data redundancy and fault tolerance. For example, a particular data component may have a size that is greater than the storage capacity of a single storage node (e.g., 256 Gb). Using the dynamic partitioning techniques, the data component can be divided into multiple smaller subcomponents and stored in multiple storage nodes. A data structure (e.g., a hash map) for the subcomponents is determined and maintained for efficient data resynchronization. It should be appreciated that multiple data components can be stored in a storage node. And data structures for the subcomponents of the multiple data components can also be determined and maintained for efficient data resynchronization.

vSAN 200 may be architected via a logical hierarchy that includes various logical layers structured in a hierarchical fashion, and include at least two storage tiers for storing multiple data objects (e.g., a CapObj and a MetaObj). FIG. 3 is a block diagram illustrating the logical hierarchal layers in vSAN 200 of FIG. 2, in accordance with some embodiments. As shown in FIG. 3, vSAN 200 includes multiple object management layers 300 and multiple object storage tiers 310. Object management layers 300 may include a striped distributed object manager (e.g., zDOM 302) that sits above a distributed object manager (e.g., DOM 304) in the hierarchy of logical object management layers 300. Object storage layers 310 include a capacity tier 312 and a performance tier 314.

Performance tier 312 may include a Local Object Manager (Performance LOM 396) that manages a local data object stored on the performance tier 312. As noted throughout, a MetaObj data object may be stored via the performance tier 312. In some embodiments, LOM 396 may be a Local Log-Structured Object Manager (LSOM). Performance LOM 396 may manage the storage (and access) of MetaObj via multiple disks configured for N-way mirroring of data stored within the performance tier 312. In the non-limiting embodiment of FIG. 3, the performance tier 312 includes three storage disks: MetaDisk_A 398A, MetaDisk_B 398B, and MetaDisk_C 298C, configured in a 3-way mirroring RAID 1 configuration. In some embodiments, multiple LOMs may be included in the performance tier 312. For example, a separate LOM may exist for each disk included in performance tier 312. Performance LOM 396 may be used to refer to the set of LOMs included in performance tier 312. As noted throughout, the performance tier 312 may include a memory bank for caching and/or buffering data.

Capacity tier 314 may include a Local Object Manager (Capacity LOM 392) that manages a local data object stored on the capacity tier 314. As noted throughout, a CapObj may be stored via the capacity tier 314. In some embodiments, Capacity LOM 392 may be a LSOM. Capacity LOM 392 may manage the storage (and access) of CapObj via multiple disks configured for storing striped and erasure coded (EC) data stored within the capacity tier 314. In the non-limiting embodiment of FIG. 3, the capacity tier 314 includes six storage disks: CapDisk_A 394A, CapDisk_B 394B, CapDisk_C 294C, CapDisk_D 394D, CapDisk_E 394E, and CapDisk_F 304F. The disks in the capacity tier 314 may be arranged in a 4+2 RAID 6 configuration. In some embodiments, multiple LOMs may be included in the capacity tier 314. For example, a separate LOM may exist for each disk included in capacity tier 314. Capacity LOM 392 may be used to refer to the set of LOMs included in capacity tier 314.

vSAN 200 may store, modify, and/or access data for a client of vSAN 200. The zDOM 302, the DOM 304, and the one or more LOMs (e.g., Performance LOM 396 and Capacity LOM 392) may manage the data as separate data objects, where the same data within the separate objects is addressed via separate logical and/or physical addresses. Address maps are employed to map the data addresses between the separate data objects. The zDOM 302 may receive a request from a client to write, update, modify, or otherwise access one or more data blocks of the data object managed by the zDOM 302. For instance, zDOM 302 may receive a client request to update the data block corresponding to the zDOM logical address L_10. The zDOM 302 may treat the DOM 304 as a physical layer, and a corresponding DOM address (e.g., a DOM physical-offset) may be determined via a lookup on the zDOM map. As discussed above in a non-limiting example, the zDOM address L_10 may correspond to the "physical" address of the DOM object: P_90. In some embodiments, another lookup in another address map (e.g., a DOM map), may be employed to determine the corresponding address at the Capacity LOM 392 layer.

FIG. 4A is a block diagram illustrating address space for striped erasure coding within the capacity tier 314 of FIG. 3, in accordance with some embodiments. As discussed in conjunction with FIG. 3, capacity tier 314 includes six disks: CapDisk_A 394A, CapDisk_B 394B, CapDisk_C 394C, CapDisk_D 294D, CapDisk_E 394E, and Cap_Disk_F 394F. The six disks of capacity tier 314 may be configured and arranged in a 4+2 RAID 6 configuration.

As discussed throughout, the capacity tier 314 stores a data object, such as a CalObj data object. Three separate 2D stripes of the CapObj are shown in FIG. 4A: first 2D stripe 402, second 2D stripe 406 and third 2D stripe 408, as demarcated by the hashed rectangles. The capacity tier 314 manages the CapObj via an LFS, and thus the storage of the CapObj may be logically treated as being stored within a logical 2D log (or buffer). Only a portion of the 2D log is shown in FIG. 4A. The CapObj may include more vertically stacked 2D stripes, not shown in FIG. 4A. The upper and lower boundaries of the 2D log (not shown in FIG. 4A) of the LFS may extend vertically beyond the top and bottom boundaries of the page of FIG. 4A.

As shown in FIG. 4A, each 2D stripe (may be logically, but not physically) arranged as a 2D array with a plurality of horizontal rows and vertical columns that form a 2D array of cells. Each cell of any particular 2D stripe may represent one data block within the particular 2D stripe within the CapObj. The cells within a vertical column represent blocks of data written to a single (virtual or physical) disk within the RAID arrangement of the capacity tier. The cells within a horizontal row may represent blocks of data within the 2D stripe distributed across the multiple (virtual or physical) disks of the RAID arrangement of the capacity tier. A horizontal row within a stripe may be referred to as a 1D stripe.

In the various embodiments, the stripe size may refer to the number of cells within a vertical column of a 2D stripe, and thus may refer to the maximum number of consecutive blocks that may be written to a single disk within the RAID arrangement. The vertical bracket 402 demonstrates that the stripe size of 2D stripe 400 is 8. The stripe size of the other 2D stripes shown in FIG. 4A (e.g., 2D stripe 406 and 2D stripe 408) is also 8. The stripe width may refer to the number of disks that payload data (not including the parity data) is written to in a 2D stripe. In the non-limiting embodiment of a 4+2 RAID 6 arrangement shown in FIG. 4A, four of the six disks may store non-parity (e.g., payload) data and the other two disks may store parity data. As indicated by the horizontal bracket 404, the stripe width of 2D stripe 400 is four. In such an embodiment, a 2D stripe may store 6*8=48 blocks of data, where 4*8=32 blocks are non-parity data blocks and 2*8=16 blocks are parity blocks. In the embodiment shown in FIG. 4A, where the block size is 16 KB, a 2D stripe may store 48*16 KB=768 KB of data, where 32*16 KB=512 KB of the data includes non-parity data and 16*16 KB=256 KB of the data includes parity data. Note that these sizes and widths are non-limiting, and the embodiments may vary in any of these numbers.

As labeled in FIG. 4A, each column of the CapObj is associated with one of the six disks and each cell is labeled with a DOM address. The nomenclature for the DOM addresses adopted in FIG. 4A is such that data blocks that store non-parity data are labeled as P_X_Y and data blocks that store parity data are labeled as PP_X_Y or PQ_X_Y (depending on whether the parity data is the P parity data or the Q parity data. X and Y are non-negative integers employed as indexes for the addresses of the DOM object. The index X may be a 2D stripe index and Y may be a data block index for the 2D stripe referred to by X. Within the 1D (horizontal) stripes of the first 2D stripe 400, the non-parity data is distributed across disks: CapDisk_A 394A—CapDisk_D 394D, and the P and Q parity data (for the non-parity data of that 1D stripe) is written to CapDisk_E 394E and CapDisk_F 394F, respectively. In some embodiments, the parity blocks may be rotated to different disks for different 2D stripes, so that parity read/write operations are not concentrated to specific disks, which avoids I/O bottlenecks. In other embodiments, the parity blocks need not be rotated to different disks. In such embodiments, two of the six disks (e.g., CapDisk_E 394E and CapDisk_F 394F) may be dedicated to parity data. As discussed throughout, the logical addresses of a zDOM object are mapped to the "physical" addresses of the DOM object, via the zDOM map.

FIG. 4B is a block diagram illustrating segments of the 2D stripe of FIG. 4A, in accordance with some embodiments. Each 2D stripe of the CapObj may include one or more 2D segments, where the one or more segments are logically stacked in a vertical fashion in the 2D stripe. The 2D stripe 400 includes two segments: first segment 412 and second segment 414. The segment size may be the number of cells within a vertical column of the segment, and thus may refer to the maximum number of consecutive blocks that may be written to a single disk within the segment. The segment size for each of segments 412/414 is four. In the embodiments discussed herein, data is sequentially written to the current segment of the current 2D stripe, where the current 2D stripe and the current segment of the current 2D stripe sequentially advances along the 2D log of the capacity tier. Thus, when a pre-existing data block in the CapObj is updated and/or modified, the pre-existing data block is not overwritten (eliminating the need for a seek operation), but rather the modified and/or updated version of the data block is written to the current segment of the current stripe. For discussion purposes, 2D stripe 400 may be considered the current 2D stripe, segment 412 may be considered the current segment, and horizontal 1D stripe 410 may be considered the current 1D stripe. Because only a single 2D stripe is shown in FIG. 4B, the nomenclature of the DOM addresses has truncated. The index indicating the stripe number has been suppressed in FIG. 4B because the stripe number in inherent, in that only a single 2D stripe is shown.

Upon receiving a request from a vSAN client to write and/or modify client data on the capacity tier, various embodiments are enabled to cache the client data, in the memory bank of the performance tier, until enough client write/modify requests are received to write a full stripe to the capacity tier. Thus, the embodiments may operate in "full stripe write mode," or "full stripe mode." The I/O operations of the performance tier are fast enough such that caching client data in the performance tier (prior to writing the client data via a "full stripe write operation") do not result in an I/O bottleneck. When the number (or rate) of outstanding I/O operations (OIO) is large enough, the embodiments may operate in full stripe write mode. When the number (or rate) of OIO is relatively low, the embodiments may operate in "partial stripe write mode," or "partial stripe mode." In partial stripe write mode, the various embodiments need not cache client data in the performance tier, but rather, the client data may be written to a partial stripe as the client data is received. In both full and partial write modes, logical map data may be written to the performance tier, as described throughout, for each write/modify transaction. In some embodiments, a full stripe write operation may include writing and/or modifying a full 2D stripe. In other embodiments, a full stripe write operation may refer to writing and/or modifying a full 1D stripe, e.g., current 1D stripe 410 in FIG. 4B.

FIG. 5A is a block diagram illustrating actions of a full stripe write mode operation 500, in accordance with some embodiments. In action (1) of operation 500, a request to write client data to a vSAN (e.g., vSAN of FIGS. 2-3) is received by the zDOM 302 of the vSAN. In some embodiments, the request may include the logical address of the zDOM object to write and/or modify. For instance, the request may include a request to modify the data block of L_10 of the zDOM object, as well as the new and/or modified client data to be stored at L_10. In other embodiments, the zDOM address may be determined via other methods, e.g., via a lookup in a map that maps the addresses of a vSAN data object to the addresses of the zDOM data object. At action (2), the checksum data for the client data may be calculated, via the zDOM 302 or another component of the vSAN. At action (3), the client data and the corresponding logical map data (e.g., the zDOM address to be written to and the checksum data for the client data) may be cached and/or stored in the memory bank of the performance tier 312. Additional write requests may be received and the additional client data (along with the corresponding logical map data) may continue to be cached in the memory bank. At action (4), the performance tier 312 may provide an acknowledgment to the zDOM 302 of the successful cache action. Additional write requests may continue to be received that include additional client data. At action (5), it is determined that enough new and/or modified client data has been received to fill a 2D and/or a 1D stripe. When enough data has been received (either over a single write request or multiple write requests), at action (6), a full stripe may be written to the CapObj 506 in the capacity tier 314. The logical map data for the stripe may be written to the MetaObj 504 in the performance tier 312. The full stripe may be written to the current segment and/or current stripe of the CapObj 506.

For example, either in a single write request or multiple write requests, the vSAN may be requested to modify the data blocks of L_10, L_20, L_30, and L_40 of the zDOM object. The request may include the modified client data for each of L_10, L_20, L_30, and L_40. A full 1D stripe may be written to the current 1D stripe (e.g., 1D stripe 410 of FIG. 4B) of the CapObj that includes the modified client data. In this example, the client data may be written via the following mapping: (L_10→P_0, L_20→P_8, L_30→P_16, L_40→P_24, P→PP_0, Q→PQ_0), where (P, Q) are the two parity data blocks for the four client data blocks (L_10, L_20, L_30, L_40). The parity blocks P and Q may be calculated via one or more layers of the vSAN. Note that this full stripe write operation requires six write operations and zero read, for a write amplification factor of 1.5. Thus, a full stripe write operation (e.g., operation 500) provides an improvement over the write amplification factor of 3.0 associated with the conventional read-modify-write problem. In various embodiments, at least portions of the logical map data may also be written to the CapObj.

FIG. 5B is a block diagram illustrating actions of a partial stripe write mode operation 550, in accordance with some embodiments. Similar to full stripe mode operation, in action (1) of operation 550, a request to write client data to a vSAN is received by the zDOM 302 of the vSAN. At action (2), the checksum data for the client data may be calculated, via the zDOM 302. At action (3a), it is determined to not write a full stripe. Rather than waiting for additional client data to write in a full stripe, the recently received client data will be written as a partial stripe write. In some embodiments, a decision to write in partial stripe mode may be based on the current number (or rate of incoming) of OIOs. For example, when the current number of OIOs is sufficiently small, an embodiment may transition from a full stripe write mode to a partial stripe write mode. At action (3b), a DOM address may be determined to which to write the client data. The DOM address may be within the current segment and/or current stripe of the CapObj. For instance, at action (3b), it may be determined to write the client data (corresponding to L_10 of the zDOM object) to P_0 of the DOM object. At action (4), the client data is written to P_0 of the DOM object, within the capacity tier 314. At action (5), the logical map data is written to the MetaObj 504 of the performance tier 312. Similar to a full stripe operation, at least portions of the logical map data may also be written to the CapObj 506.

The various embodiments may handle multiple types of partial stripe writes, including small partial stripe writes and large partial stripe writes. In 4+2 RAID 6 embodiments, a small partial stripe write operation may be a write operation where a single block of client data is written to the CapObj 506. In the above partial stripe example, where the L_10 (the zDOM address) data block was written to the P_0 DOM address is an example of a small partial stripe write. In the 4+2 RAID 6 embodiments, a large partial stripe write may be a write operation that writes two or three blocks of client data to the CapObj 506. The closer number of OIOs is to a full 1D stripe, the larger the reduction in the write amplification factor. As noted throughout, in conventional EC, the write amplification factor is 3.0. A single data block small partial stripe write transaction (OIO=1) requires three write operations to the capacity tier, for a write amplification factor of 3.0. A double data block large partial stripe write transaction (OIO=2) requires four write operation to the capacity tier, for a write amplification factor of 2.0. A triple data block large partial stripe write transaction (OIO=3) requires five write operations to the capacity tier, for a write amplification factor of 1.67. A quadruple data block full 1D stripe write transaction (OIO=4) requires six write operations to the capacity tier, for a write amplification factor of 1.5. A stripe write transaction for five blocks of client data (OIO=5) requires 9 (six for a full 1D stripe and three for a small partial 1D stripe) write operations to the capacity tier, for a write amplification factor of 1.8. A stripe write transaction for six blocks of client data (OIO=6) requires 10 (six for a full 1D stripe and four for a large 1D partial stripe) write operations to the capacity tier, for a write amplification factor of 1.67. A stripe write transaction for seven blocks of client data (OIO=6) requires 11 (six for a full 1D stripe and five for a large partial 1D stripe) write operations to the capacity tier, for a write amplification factor of 1.57. A stripe write transaction for eight blocks of client data (OIO=8) requires 12 (six for each of two full 1D stripes) write operations to the capacity tier, for a write amplification factor of 1.5.

In general, for larger OIO, the efficiently full stripe write interactions may be employed to reduce the write amplification factor associated with the write transaction to the capacity tier. If the zDOM map becomes too large to cache in the memory bank of the performance tier because the address of writes becomes sufficiently random or insufficiently contiguous, at least some of the Logical Map Pages associated with the write transactions are migrated to the capacity tier. As noted throughout, because the logical map data associated with the current stripe is cached in the memory bank of the performance tier, these write transactions may not require a read operation (from the capacity tier) for the logical map data. However, from time to time when this condition occurs, an extra read operation from the capacity tier may be required to retrieve the logical map data encoded in Logical Map Pages that have been migrated to the capacity tier. Although, in many embodiments, this condition will not occur when the write operations are contiguous and/or local (e.g., the client data to be updated is not randomly scattered in the zDOM logical space).

In some embodiments, during a write transaction to the capacity tier for a full or partial stripe, the Logical Map page may also be written to the capacity tier and in the current stripe, in the form of the logical map data for the write transaction. FIGS. 6A-6D provide block diagrams illustrating various write transactions that include writing corresponding logical map data to the capacity tier, in accordance with some embodiments. FIG. 6A shows current segment 412 of FIG. 4B. Current segment 412 includes four 1D stripes: first 1D stripe 602, second 1D stripe 604, third 1D stripe 606, and fourth 1D stripe 608. In FIG. 6A, a first write transaction request may be received. The first write request may be a request to write three client data blocks to the respective zDOM logical addresses: (L_30, L_40, L_50). In conventional EC systems, nine read and nine write operations would be required. That is, to write three conventional partial stripes, three reads and three writes are required for each of the three partial stripe writes. However, in the various embodiments, only six write operations (and no read operations are required). FIG. 6A shows the placement of the three blocks in the first 1D stripe 602 of current segment 412, along with the logical map data for this first write transaction. As shown in FIG. 6A, the write operations to the first 1D stripe 602 are as follows: (L_30, L_40, L_50, LOG_1, P_Data_0, Q_Data_0) to the following DOM addresses in the first 1D stripe 602: (P_0, P_8, P_16, P_24, PP_0, PQ_0). LOG_1 includes the corresponding logical map data for this first write transaction and P_Data_0 and Q_Data_0 are the corresponding P and Q parity data for the first 1D stripe 602.

In FIG. 6B, a second write transaction request may be received. The second write request may be a request to write seven additional client data blocks to the respective zDOM logical addresses: (L_32, L_42, L_52, L_62, L_72, L_82, L_92). In conventional EC systems, 21 read and 21 write operations would be required. However, in the various embodiments, only 12 write operations (and no read operations are required). FIG. 6B shows the placement of four of the seven blocks in the second 1D stripe 604 of current segment 412. The remaining three blocks of data, along with the logical map data for this second write transaction (e.g., LOG_2) are written to the third 1D stripe 606. As shown in FIG. 6B, the write operations to the second 1D stripe 604 are as follows: (L_32, L_42, L_52, L_62, P_Data_1, Q_Data_1) to the following DOM addresses in the second 1D stripe 604: (P_1, P_9, P_17, P_25, PP_1, PQ_1). P_Data_1 and Q_Data_1 are the P and Q parity data for the second 1D stripe 304. The write operations to the third 1D stripe 606 are as follows: (L_72, L_82, L_92, LOG_2, P_Data_2, Q_Data_2) to the following DOM addresses in the third 1D stripe 606: (P_2, P_10, P_18, P_26, PP_2, PQ_2). P_Data_2 and Q_Data_2 are the P and Q parity data for the third 1D stripe 306. LOG_2 includes the corresponding logical map data for this second write transaction Note that in some embodiments, only a single LOG entry is needed in a current segment. Thus, in the example shown in FIG. 6B, LOG_2 may encode the logical map data corresponding to the second write transaction, as well as the logical map data for the first write transaction of FIG. 6A. In such embodiments, P_24 storing LOG_1 may be re-allocated to store other data. Such freeing up of blocks may be done in a "garbage collection" process. FIG. 6C-6D demonstrate the re-allocation of logical map data blocks when successive write requests are received. In FIG. 6C, a first write request is received to write a first block of client data to L_10 of the zDOM object. In FIG. 6C, L_30 is written to P_0 (of the DOM object) of the first 1D data stripe 602 and the corresponding LOG_1 is written to P_8 (of the DOM object) of the first 1D data stripe 602. A second write request is subsequently received to write a second block of client data to L_40 of the zDOM object. FIG. 6D shows L_40 written to P_1 (of the DOM object) of the second 1D data stripe 604 and the corresponding LOG_2 is written to P_9 (of the DOM object) of the second 1D data stripe 604. In addition to the logical map data of this second write transaction, LOG_2 may encode the logical map data of the first write transactions (e.g., the logical map data encoded in LOG_1). Thus, as indicated in FIG. 6D, P_8 of the DOM, object may be feed-up and/or re-allocated for other purposes. Note that a read operation of P_8 from the capacity tier may not be required to encode the contents of LOG_1 in LOG_2, because the contents of LOG_1 may be currently cached in the memory bank of the performance tier.

FIGS. 7-11 illustrate flowcharts of exemplary methods 700, 800, 900, 1000, and 1100 for managing client data in a distributed-computing system, in accordance with some embodiments. Methods 700-1100 may be performed, for example, by one or more distributed computing systems, such as but not limited to vSAN 200 of FIGS. 2-3. In some embodiments, the distributed-computing system (e.g., a vSAN) comprises a plurality of storage nodes or host computing devices (e.g., host computing device 100 described in reference to FIG. 1A) that are communicatively coupled together in a vSAN. In some embodiments, the distributed-computing system is implemented by one or more virtual machines (e.g., VM 102 described in reference to FIGS. 1A-1B). The distributed-computing system may include a hierarchy of object management layers or levels that implement data object managers, as well as multiple storage tiers. In some embodiments, the operations of methods 700-1100 are distributed across the various systems (e.g., storage nodes) of the distributed-computing system. In methods 700-1100, some blocks are, optionally, combined, the order of some blocks is, optionally, changed, and some blocks are, optionally, omitted. In some embodiments, additional operations may be performed in combination with methods 700-1100.

A zDOM layer of the distributed-computing system may implement a zDOM, a DOM layer of the distributed-computing system may implement a DOM, and one or more LSOM layers of the distributed-computing system may implement one or more LSOMs. The distributed-computing system may a lso include a capacity storage tier and a performance storage tier. The capacity storage tier may include a first plurality of storage disks storing a capacity data object (e.g., a CapObj) structuring a set of client data blocks as plurality data stripes that are erasure coded (EC) and distributed across the first plurality of disks. A client data block may be a block of client data stored by the vSAN. Each of the plurality of data stripes may include a subset of the set of client data blocks and corresponding parity data for the subset of client data blocks. The performance storage tier may include a second plurality of storage disks storing a metadata object (e.g., a MetaObj) structuring logical map data as being mirrored across the first plurality of disks. The logical map data may include an address map (e.g., a zDOM address map) indicating, for each client data block of the set of client data blocks, a correspondence between a logical address associated with a first layer (e.g., the zDOM layer) of the system and a physical address associated with a second layer (e.g., the DOM layer) of the system.

As noted throughout, the capacity tier may be managed by a log-structured file system (LFS). The performance tier may be managed by another file system that enables overwriting the logical map data. The input/output (I/O) throughput of the performance tier may be greater than an I/O throughput of the capacity tier. In at least one embodiment, the I/O throughput of the performance tier is at least seven times greater than an I/O throughput of the capacity tier. The first plurality of disks of the capacity tier may be arranged in a 4+2 RAID 6 configuration. The second plurality of disks of the performance tier may be arranged in a 3-way mirroring configuration. The first layer of the system may be a striped Distributed Object Manager (zDOM). The second layer of the system in a Distributed Object Manager (DOM).

At block 702, a request for a write transaction may be received at the distributed-computing system (e.g., a vSAN). The request may be received from a client of the distributed-computing system. The write transaction request may be a request to store the one or more additional client data blocks in the capacity storage tier. That is, the request may be a request to include the one or more additional client data blocks to the set of client data blocks stored in data stripes in the CapObj, where the CapObj is stored by the capacity tier. The additional client data blocks may be new client data blocks, or updates and/or modifications to the client data blocks already stored in the capacity tier.

At block 704, a logical address (e.g., the zDOM address) for each of the additional client data blocks may be determined. In some embodiments, the request received at block 702 may indicate the logical address for each of the additional client data blocks. For example, the request may be a request to modify and/or replace the client data currently stored in a specific block (e.g., L_10) of the zDOM data object with new and/or modified client data. In other embodiments, the logical address for the additional client data blocks may be determined via other ways, e.g., logical map data, a look-up table, or the like. Also at block 704, a corresponding physical address (e.g., a corresponding DOM address) for each of the additional client data blocks may be determined. As described below throughout, each of the additional data client data blocks will be written to CapObj at an address corresponding to the determined physical address. Thus, the physical addresses may be physical addresses for the write transaction requested at block 702. In some embodiments, the physical address may be an address in a current 2D or 1D data stripe, associated with the CapObj. As noted throughout, the CapObj is managed by an LFS. Thus, the physical addresses to write the additional client data blocks may be an address corresponding to the current segment and/or data stripe of the LFS. Various embodiments for determining a DOM object address (e.g., a physical address) to write a client data block to are discussed throughout, including but not limited to in conjunction with FIGS. 6A-6D.

At block 706, logical map data for the write transaction is generated. In some embodiments, the logical map data may be in addition to logical map data already stored in the performance tier and/or capacity tier for the data blocks of the set of data blocks. As noted throughout, the logical map data may be structured as a B-tree, such as but not limited to a B++tree. In addition to encoding the mapping between the zDOM (e.g., logical) addresses and the DOM (e.g., physical) address, the logical map data may further encode checksum data for the write transactions. In some embodiments, a leaf node of the B-tree may encode a key-value pair indicating an entry in the address map for one or more of the client data blocks written to the capacity tier via a write transaction. The key of the key-value pair may indicate the logical address of a client data block. The value of the key-value pair may indicate the corresponding physical address of the client data block. The value of the key-value pair may further indicate a number of the client data blocks that have contiguous logical addresses and contiguous physical addresses in the zDOM and DOM objects. The value of the key-value pair may also indicate checksum data for the client data blocks. A storage volume of each of the plurality of leaf pages (or nodes) may be 512 bytes.

At block 708, the additional client data blocks may be written to the capacity tier. Various embodiments of writing client data to the capacity tier are discussed in conjunction with at least FIGS. 5A-5B and 8. However, briefly here, the vSAN may be operated in a full stripe write mode or a partial stripe write mode, which are discussed throughout. In full stripe write mode, the additional client data blocks may be temporarily cached in the performance tier, while awaiting for enough client data to write to a full data stripe to the capacity tier. Whether in full stripe write mode or partial stripe mode, the additional client data blocks are written to the determined physical addresses, with respect to the DOM data object, of the current data stripe. In some embodiments, storing the additional client data blocks may include accessing, from the memory bank in the performance tier, the corresponding parity data for a subset of client data blocks of the current data stripe. The subset of client data blocks of the current data stripe may be updated to include the additional client data blocks. The corresponding parity data for the updated subset of client data blocks of the current data stripe may be updated based on the one or more additional client data blocks. The updated corresponding parity data may be cached in the memory bank of the performance tier.

At block 710, the logical map data generated at block 706 may be written to and/or stored on the performance tier. Various embodiments of writing logical map data to the performance tier are discussed in conjunction with at least FIGS. 5A-5B and 8. However, briefly here, the vSAN logical map data may be written to a B-tree in the performance tier. The logical map data may be written to the MetaObj in the performance tier. Storing the logical map data may include updating the zDOM address map to indicate the correspondence between the logical address and the physical address for each of the one or more additional client data blocks. Method 700 may return to block 702 to await additional requests for write transactions.

Figure 8:
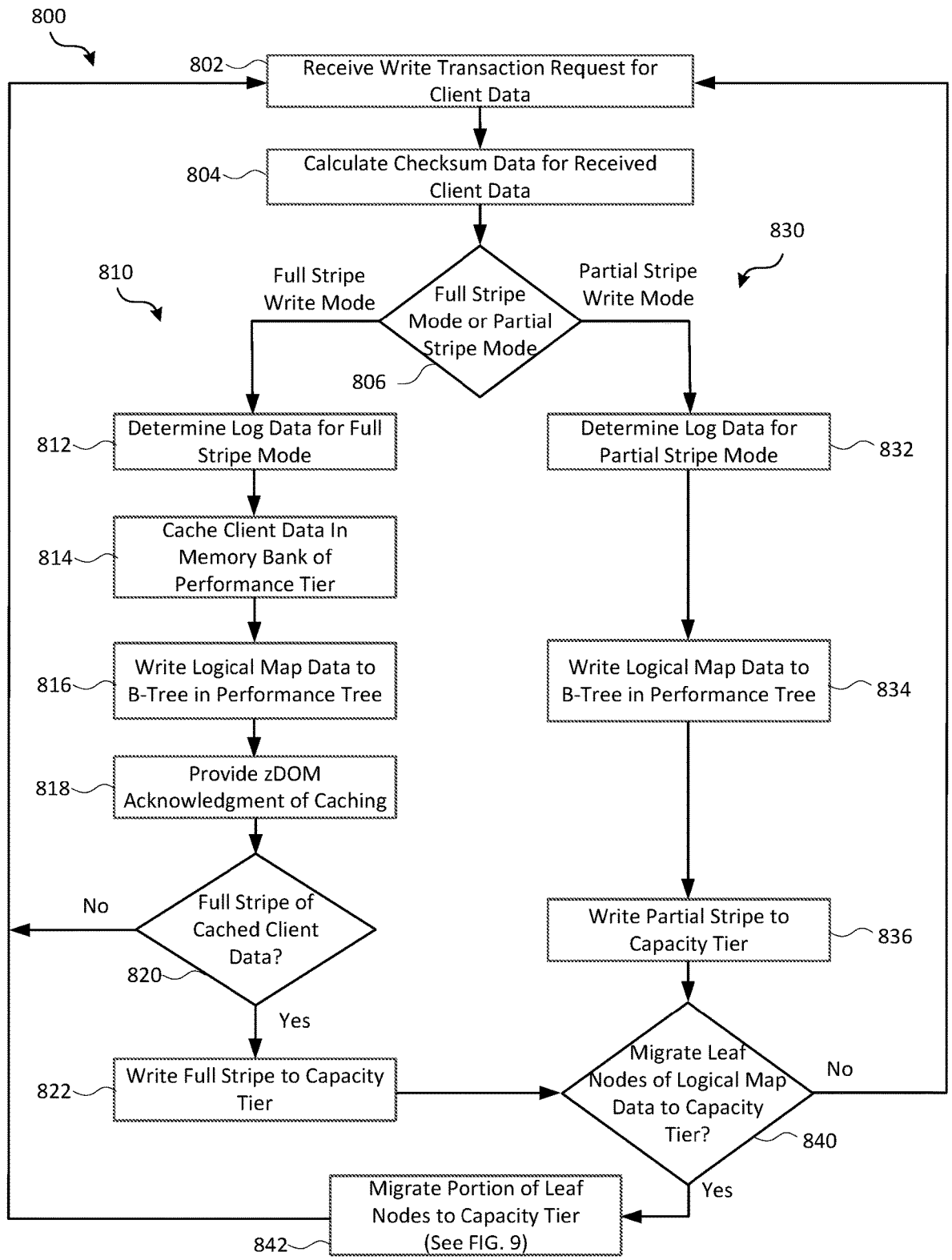

FIG. 8 illustrates a flowchart of another exemplary method 800 for storing client data in a distributed-computing system, in accordance with some embodiments. At block 802, a request for a write transaction is received. The request received at block 802 may be similar to the request received at block 702 of method 700, and thus may include a request to store client data blocks in a vSAN. At block 804, checksum data for the client data blocks may be calculated. Various methods and/or algorithms may be employed to calculate the checksum data, such as but not limited to a cyclic redundancy check (CRC) algorithm.

At decision block 806, it is decided whether to operate the vSAN in a full stripe write mode or a partial stripe write mode. In some embodiments, the decision may be automatically made in real-time after the request is received. In such embodiments, the decision may be based on a count or rate of outstanding I/O operations (OIO). For example, if the count or rate of OIO is greater than a predetermined OIO threshold, then the vSAN may be operated in a full stripe write mode. When the count or rate of OIO is less than (or equal to) the predetermined OIO threshold, then the vSAN may be operated in a partial stripe write mode. In other embodiments, the decision may be predetermined by an operational mode setting of the vSAN. For example, an administrator or another user with enhanced privileges (e.g., a super-user), of the vSAN may manually set the operation mode of the vSAN to be in full stripe write mode or partial stripe write mode. If the vSAN is operated in full stripe write mode, method 800 progresses toward branch 810 of method 800 and onto block 812. If the vSAN is operated in partial stripe write mode, method 800 progresses toward branch 830 of method 800 and onto block 832.

In full stripe write mode, and at block 812, the logical map data for the write transaction is determined. At block 814, and in accordance with the vSAN being in a full stripe write mode, the client data block are cached in the memory bank of the performance tier. At block 816, the logical map data is added to a B-tree, stored in the performance tier, that encodes the logical map data for the capacity tier. At block 818, the zDOM is provided with an acknowledgment of the successful caching of the client data and recording of the associated logical map data in the performance tier. At decision block 820, it determined whether enough client data has been cached in the performance tier to fill a dull 1D or a 2D data stripe. This decision may be based on determining whether a size or volume of the current contents of the memory bank in the performance tier, is equivalent to the size of the current data stripe. If a full stripe of client data has not been cached yet, method 800 returns to block 802 to receive additional requests to write additional client data blocks to the capacity tier. If enough client data has been cached, method 800 flows to block 822. At block 822, the full stripe of client data cached in the performance tier, is written to the capacity tier. Process 800 may then merge with the partial stripe write mode branch 830 and flow to decision block 840.

When method 800 enters the partial stripe write mode 830, and at block 832, the logical map data for the partial stripe write mode is determined. At block 834, the logical map data may be written to the B-tree in the performance tier. At block 836, the client data blocks are written to the capacity tier as a partial stripe. Method 800 may then merge with the full stripe write more branch 810 and flow to decision block 840.

At decision block 840, it is determined whether to migrate at least a portion of the leaf nodes of the B-tree encoding the logical map data are to be migrated to the capacity tier. If leaf nodes are to be migrated to the capacity tier, method 800 may flow to block 842. Otherwise, method 800 may return to block 802 and await for additional requests for write transactions. At block 842, at least a portion of the leaf nodes (or leaf pages) may be migrated from the performance tier to the capacity tier. Various embodiments of determining whether to migrate leaf nodes and the migrating of the leaf nodes are discussed in conjunction with at least method 900 of FIG. 9. Method 800 may return to block 802 and await for additional requests for write transactions.

Figure 9:
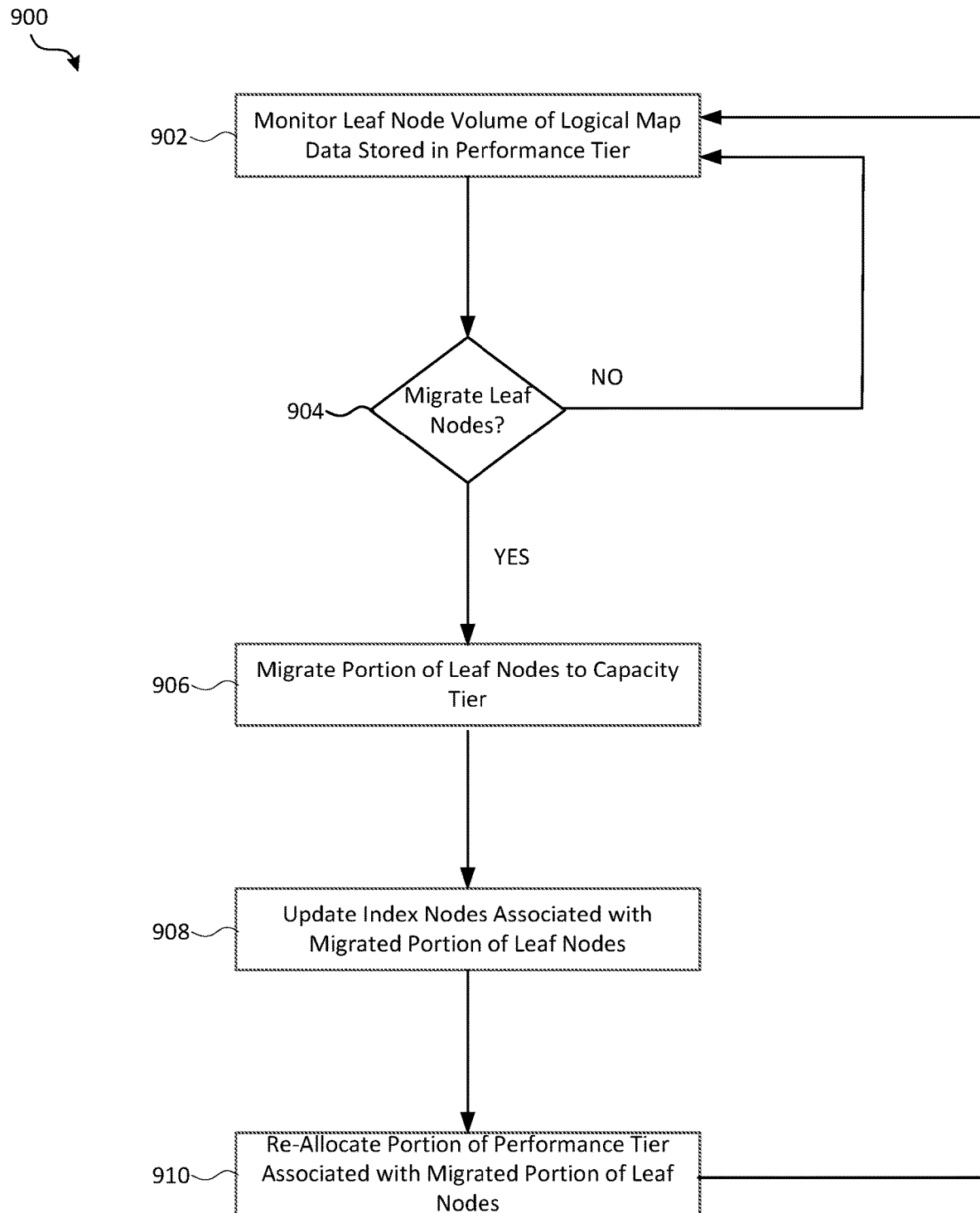

FIG. 9 illustrates a flowchart of another exemplary method 900 for storing client data in a distributed-computing system, in accordance with some embodiments. At block 902, the volume of logical map data stored in the memory bank of the performance tier is monitored. In some embodiments, the volume of the leaf nodes (e.g., Logical Map Pages) stored in the performance tier is monitored. For example, a storage volume associated with the leaf nodes may be determined at block 902. At decision block 904, based on the storage volume associated with the leaf nodes stored in the performance tier, it is determined whether to migrate at least a portion of the leaf nodes to the capacity tier. For example, if the current storage volume of the leaf nodes is greater than a predetermined volume threshold, then at least a portion of the leaf nodes may be migrated to the capacity tier. If some of the leaf nodes are to be migrated to the capacity tier, method 900 may flow to block 906. If the current storage volume is less than the volume threshold, then method 900 may return to block 902 to continue monitoring the volume of logical map data stored in the performance tier.

At block 906, and in response and/or accordance to determining that the storage volume of the plurality of leaf nodes stored on the performance tier is greater than a predetermined volume threshold, at least a portion of the leaf nodes may be migrated to one or more of the plurality of data stripes of the capacity storage. At block 908, the index nodes including pointers to the migrated portion of the leaf nodes may be updated to include pointers to the new addresses of the migrated leaf nodes on the capacity tier. That is, the affected portion of the index nodes may be updated to include updated pointers to the migrated portion of the leaf nodes. The updated pointers may include physical addresses of the data stripes of the capacity storage that store the migrated portion of the plurality of leaf nodes. At block 908, the portion of the performance tier that previously included the migrated leaf nodes may be re-allocated and/or feed-up to store subsequent leaf nodes, or other data. Prior to migration to the capacity tier, a leaf node (or leaf page) in the migrated portion of leaf nodes may be stored in a memory bank of the capacity tier.

Figure 10:
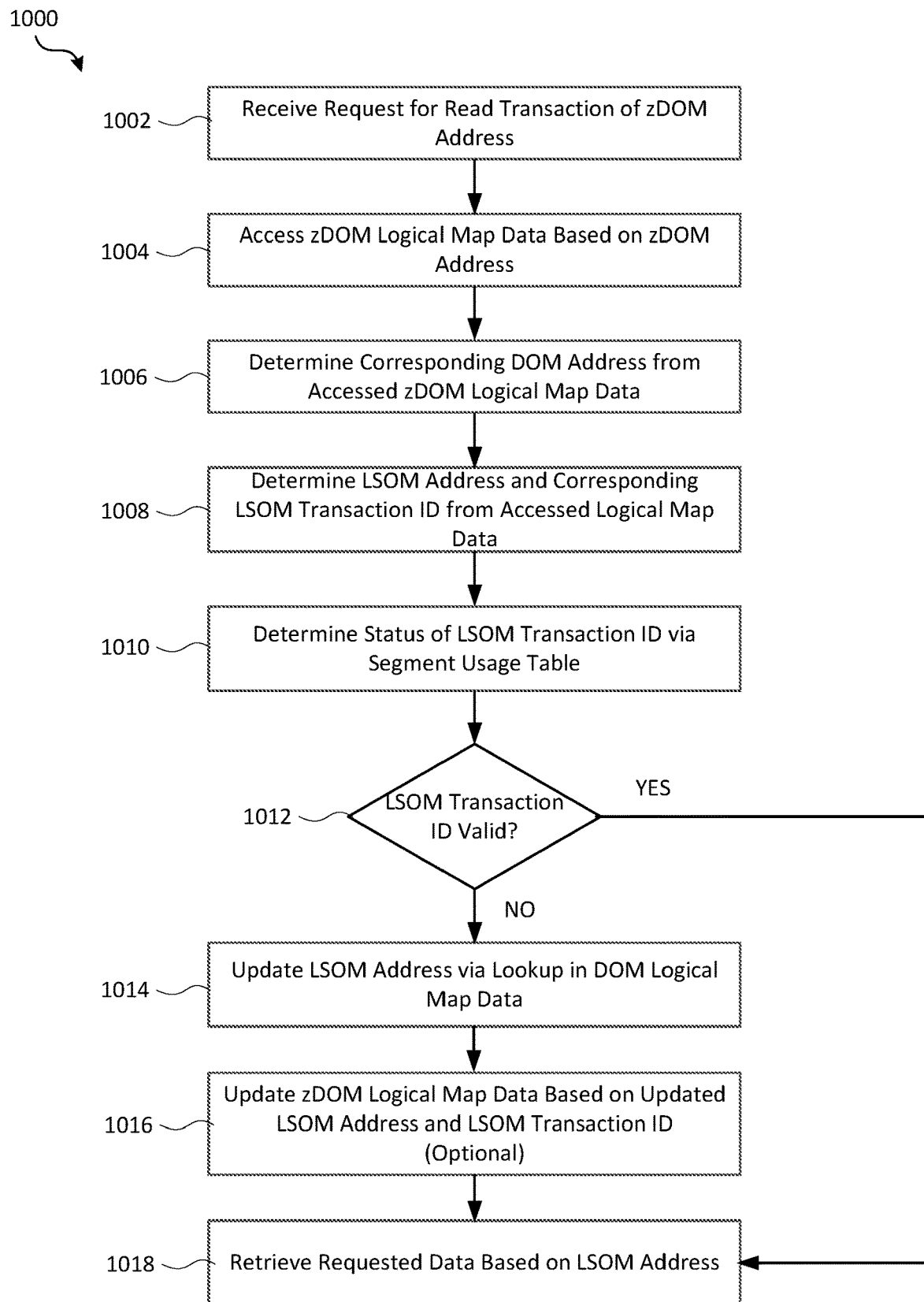

FIG. 10 illustrates a flowchart of an exemplary method 1000 for providing client data in a distributed-computing system, in accordance with some embodiments. In the following embodiments, the zDOM layer may be referred to as a first DOM, the DOM layer may be referred to as a second DOM, and the LSOM layer may be referred to as a LOM. Also, in the various embodiments, client data may be structured as a set of data blocks. The zDOM layer may employ zDOM addresses (e.g., a set of logical addresses) to reference the set of data blocks. The DOM layer may employ DOM addresses (e.g., a set of physical addresses) to reference the set of data blocks. zDOM logical map data (e.g., first mapping data) may encode a mapping or correspondence between the zDOM addresses and the DOM addresses. The zDOM logical map data may be encoded in a zDOM B-Tree (e.g., a first B-Tree). The LSOM layer may employ LSOM addresses (e.g., a set of local addresses) to address the set of data blocks. LSOM logical map data (e.g., second mapping data) may encode a mapping or correspondence between the DOM addresses and the LSOM addresses. The LSOM logical map data may be encoded in a DOM B-Tree (e.g., a second B-Tree). When data a data block is written at the LSOM layer, a LSOM transaction ID (e.g., a LOM transaction ID) may be generating, resulting is a generated set of LSOM transaction IDs. A LSOM transaction ID may be associated with the corresponding LSOM address (e.g., the LSOM address that references where the data block was written to). A segment usage table (SUT) may indicate a current status of each of the transaction IDs in the set of LSOM transaction IDs.

Process 1000 starts, at block 1002, where a request for a read transaction (or operation) is received. The read request may be a request to provide the requested data to a client. The request may indicate a zDOM address associated with the requested data blocks. At block 1004, logical map data (e.g., the zDOM logical map data) may be accessed. For example, the zDOM B-Tree may be accessed at block 1004. At block 1006, the accessed logical map data may be employed to determine, identify, or otherwise lookup the DOM address corresponding to the zDOM address. In some embodiments, at block 1006, the zDOM B-Tree may be consulted or employed to determine the DOM address corresponding to the zDOM address. In some embodiments, a candidate LSOM and a corresponding LSOM transaction ID (e.g., a generation ID) may be included in the zDOM logical map data. For example, when the requested data was previously written to the capacity tier, the LSOM may have provided the zDOM (or the DOM) with the corresponding LSOM generation ID for the written data. When the logical map data was written to the zDOM B-Tree, the candidate LSOM address and corresponding LSOM transaction ID may be written to the key-value pair in the B-Tree. At block 1008, the zDOM logical map data may be employed to determine the candidate LSOM address and the corresponding LSOM transaction ID (e.g., the generation ID), which correspond to the zDOM and DOM addresses of the requested data blocks.

At block 1010, the status of the LSOM transaction ID may be determined. For example, at block 1010, the zDOM may send the LSOM at least the candidate LSOM address and the LSOM transaction ID. The zDOM may send the information directly to the LSOM, or indirectly via the DOM layer. As discussed above, the LSOM may generate, maintain, and store a segment usage table (SUT). The SUT may be a lookup table cached in relatively fast (compared to disk access) RAM. The SUT may keep track of a current status (e.g., valid v. invalid) of the LSOM transaction IDs. A LSOM transaction ID may have been marked as invalid in the SUT, when the data written to the LSOM address (e.g., in the write transaction that generated the LSOM transaction ID) has been subsequently moved to another address. For example, the LSOM may move blocks of data to new LSOM addresses during segment cleaning operations. Thus, an invalid LSOM transaction ID may be an expired or "stale" transaction ID that has been superseded by a subsequent (and valid) LSOM transaction ID that is associated with the updated LSOM address that now stores the data block that was previously stored at the expired LSOM address associated with the invalid LSOM transaction ID. At block 1010, the LSOM may employ the SUT to determine the current status of the LSOM transaction ID stored in the zDOM logical map data. If the current status is valid, then the requested data block is located at the candidate LSOM address that is stored in the zDOM logical map data. If the current status of the LSOM transaction ID is expired, then the requested data block is no longer located (or stored) at the candidate LSOM address (e.g., because a segment cleaning operation has "moved" the requested data block). Thus, for invalid LSOM transaction IDs, the LSOM logical map data (e.g., a B-Tree) may need to be consulted to determine the update LSOM address. When the LSOM transaction ID is valid, the requested data block is still stored at the candidate LSOM transaction ID, and thus the consultation with the LSOM logical map data is not required. It is noted that because the B-Tree storing the LSOM logical map data is stored on disk and the SUT is cached on RAM, looking up the current status of the LSOM transaction ID in the SUT may be a significantly faster operation than consulting the B-Tree to look up an LSOM address. At decision block 1012, if the LSOM transaction ID is valid, then process 1000 flows to block 1018. Otherwise, process 1000 flows to block 1014.

At block 1014, and in response (or accordance) to determining that the current status of the LSOM transaction ID is invalid (e.g., expired or stale), the LSOM logical map data may be consulted to determine an updated LSOM address for the requested block. For example, the B-Tree (encoding the LSOM logical map data) that includes the mapping between the DOM address may be employed to determine or identify the updated LSOM address that currently stored to requested data block. At optional block 1016, the zDOM logical map data may be updated to reflect the updated LSOM address, as well as the subsequent LSOM transaction ID that is associated with the updated LSOM address. At block 1018, the requested data block is accessed and/or retrieved based on the LSOM address. In some embodiments, the retrieved data may be provided to the party (e.g., a client) that requested the data.

Figure 11:
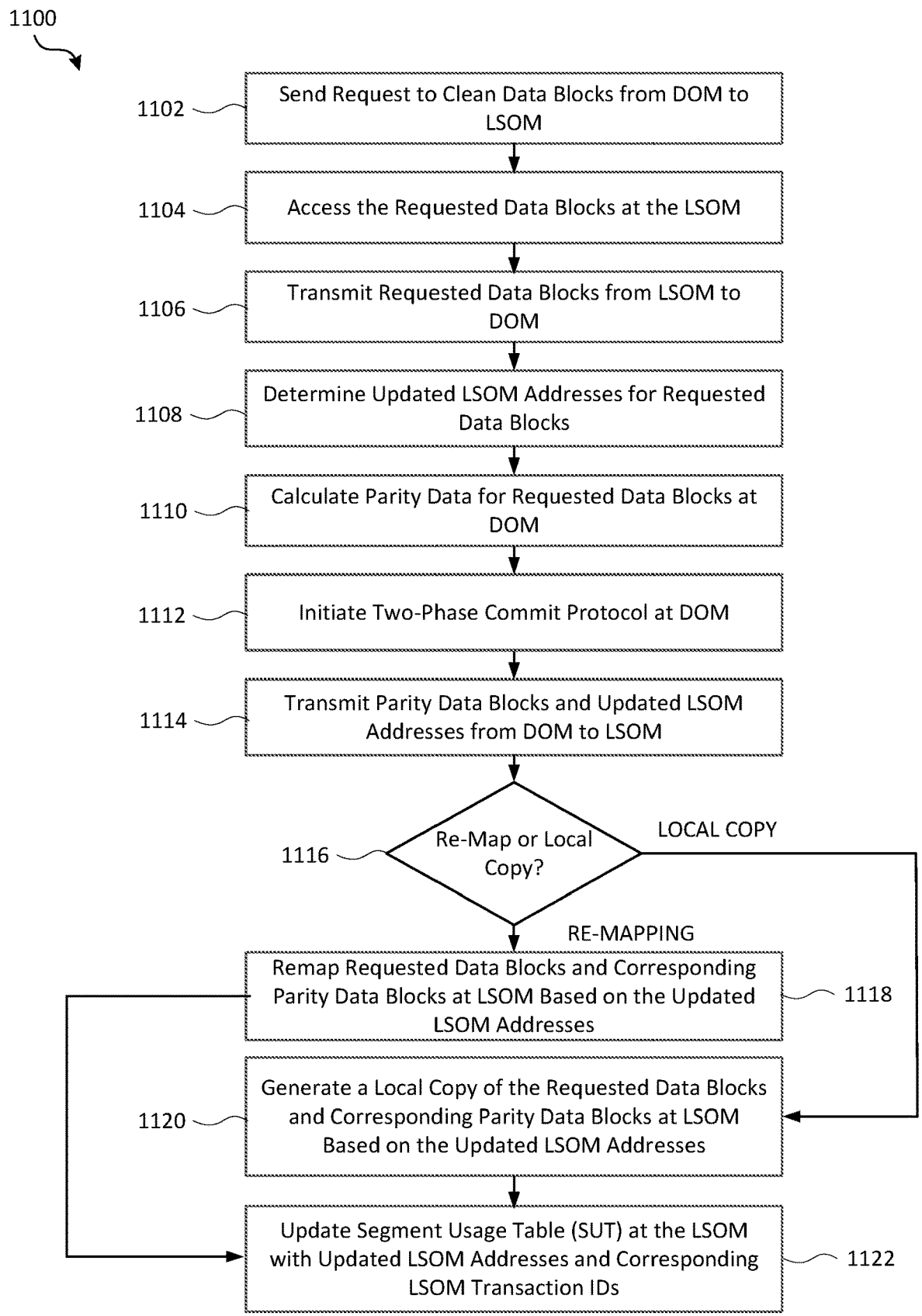

FIG. 11 illustrates a flowchart of an exemplary method 1100 for segment cleaning in a distributed-computing system, in accordance with some embodiments. Similar to method 1000 of FIG. 10, in the following embodiments, the zDOM layer may be referred to as a first DOM, the DOM layer may be referred to as a second DOM, and the LSOM layer may be referred to as a LOM. Also, in the various embodiments, client data may be structured as a set of data blocks. The zDOM layer may employ zDOM addresses (e.g., a set of logical addresses) to reference the set of data blocks. The DOM layer may employ DOM addresses (e.g., a set of physical addresses) to reference the set of data blocks. zDOM logical map data (e.g., first mapping data) may encode a mapping or correspondence between the zDOM addresses and the DOM addresses. The zDOM logical map data may be encoded in a zDOM B-Tree (e.g., a first B-Tree). The LSOM layer may employ LSOM addresses (e.g., a set of local addresses) to address the set of data blocks. LSOM logical map data (e.g., second mapping data) may encode a mapping or correspondence between the DOM addresses and the LSOM addresses. The LSOM logical map data may be encoded in a DOM B-Tree (e.g., a second B-Tree). A first subset of the set of data blocks may be stored in a current segment of a plurality of disks and a second subset of the set of data blocks may be stored in a segment that was previously the current segment (e.g., a previous segment) of the plurality of disks. The previous segment may be a dirty segment in that the second subset of data blocks may be live data blocks.

Method 1100 begins, at block 1102, where a request is sent, from the DOM to the LSOM, to clean one or more data blocks. The data blocks to be cleaned may be live blocks that are currently associated with the previous (and dirty) segment. For example, as discussed above, the DOM may request the cleaning of the previous segment and the segment to be cleaned includes the second subset of data blocks. The request may be a request to include the second subset of data blocks in the current segment. Thus, the request may be a request to include the second subset of data blocks in the first subset of data blocks. In the above discussed example, a request to clean the previous segment may include a request to include 400 live data blocks in the previous segment (e.g., the second subset of data blocks) to the data blocks included in the current segment (e.g., the first subset of data blocks).

At block 1104, the LSOM may access the requested data to be cleaned (e.g., the second subset of data blocks). At block 1106, the requested data blocks may be transmitted from the LSOM to the DOM. For instance, the 400 blocks of live data may be transmitted from the LSOM to the DOM. At block 1108, updated LSOM addresses for the data blocks to be cleaned may be determined. The updated LSOM addresses may be in the current segment of the plurality of disks. In some embodiments, the updated LSOM addresses may be determined or identified at the DOM. In other embodiments, the updated LSOM addresses may be determined at the LSOM. In some embodiments, LSOM addresses may be determined for parity data blocks. At block 1110, parity data for requested data blocks may be calculated, generated, or otherwise determined. In some non-limiting embodiments, the parity data may be calculated at the DOM. For instance, 200 blocks of parity data, for the 400 blocks of requested data, may be calculated at the DOM. At block 1112, the DOM may initiate a two-phase commit protocol. The two-phase commit protocol may be initiated with a commit request to the LSOM to receive the parity data blocks. In some embodiments, the commit-request may include a commit-request to the LSOM to re-map the live data blocks. In other embodiments, the commit-request may include a commit-request to generate a local-copy of the live data blocks. At block 114, the parity data may be transmitted to the LSOM. For example, the DOM may transmit the 200 blocks of parity data to the LSOM. In embodiments, the DOM may await for an affirmative vote that the LSOM is in a state enabled to receive the parity data blocks and initiate the re-mapping or local copying of the live data blocks.

At decision block 1116, it is determined whether the embodiment is a re-mapping or a local copying embodiment. If the embodiment is a remapping embodiment, the method 1100 flows to block 1118. Otherwise, process 1100 flows to block 1118. At block 1118, and for re-mapping embodiments, the live data blocks and the parity data blocks are remapped to the updated LSOM addresses. As shown in FIG. 11, process 1100 may flow to block 1122 At block 1120, and for local copy embodiments, the LSOM may generate a local copy of the live data blocks and the corresponding parity data blocks at the updated LSOM addressed. Blocks 1118 or 1120 may be initiated via an affirmative vote that the LSOM is in a state enabled to perform the remapping and/or local copying operations. At block 1122, a segment usage table (SUT) may be updated, at the LSOM, based on the updated LSOM addresses and the corresponding LSOM transaction IDs. For example, the SUT may be updated to indicate the previous LSOM transaction IDs associated with the live data blocks are invalid and/or expired. THE SUT may be further updated to include the new LSOM transaction IDs that are associated with remapping or local copying the live data blocks to the updated LSOM addresses. The new LSOM transaction IDs may be indicated as valid in the SUT. In some embodiments, the LSOM transaction IDs and/or the updated LSOM addresses may be provided to the zDOM and/or the DOM, such that the zDOM logical mapping data may be updated to indicate the cleaning of the previous segment.

In accordance with some implementations, a computer-readable storage medium (e.g., a non-transitory computer-readable storage medium) is provided, the computer-readable storage medium storing one or more programs for execution by one or more processors of an electronic device, the one or more programs including instructions for performing any of the methods or processes described herein.

In one embodiment, a system includes a capacity storage tier that includes a first plurality of storage disks. The first plurality of disks store a capacity data object structuring the set of client data blocks as plurality data stripes. The data stripes are erasure coded (EC) and distributed across the first plurality of disks. Each of the data stripes includes a subset of the set of client data blocks and corresponding parity data for the subset of client data blocks. The system may also include a performance storage tier that includes a second plurality of storage disks. The second plurality of disks include storing a metadata object that structures its data as being mirrored across the first plurality of disks. The metadata object includes an address map indicating, for each client data block of the set of client data blocks, a correspondence between a logical address associated with a first layer of the system and a physical address associated with a second layer of the system, and also an area of logging to log the data and metadata.

The system may further include one or more processors and a memory storing one or more programs. The programs may be configured to be executed by the one or more processors. The one or more programs including instructions for performing a method. The method comprises receiving a request from a client of the system. The request may be a request to include one or more additional client data blocks in the set of client data blocks. The request may indicate the logical address for each of the one or more additional client data blocks. The method may further comprise, for each of the one or more additional client data blocks, determining a corresponding physical address included in a current data stripe of the plurality of data stripes. Each of the one or more additional client data blocks may be stored at the corresponding physical address in the current data stripe of the capacity tier. Additional metadata may be stored in the metadata object. Storing the additional metadata includes storing data in the log area and after a full stripe of data is accumulated, updating the address map to indicate the correspondence between the logical address and the physical address for each of the one or more additional client data blocks.

In some embodiments, the performance tier may include a memory bank. The method may further include, based on a number of outstanding input/output operations (OIO) of the system being greater than a predetermined threshold, operating the system in a full stripe write mode. In accordance to operating the system in the full stripe write mode, the one or more additional client data blocks may be cached in the memory bank of the performance tier. Another request may be received from the client of the system. The request may be a request to include a third client data block in the set of client data blocks. The third client data blocks in may be cached in the memory bank of the performance tier. In accordance to determining that a size of current contents of the memory bank, the one or more additional client data blocks and the third client data blocks, is equivalent to a size of the current data stripe. For each of the contents of the memory bank, the corresponding physical address included in the current data stripe may be determined. Each of the contents of the memory bank may be stored at the corresponding physical address in the current stripe of the capacity tier.

In some embodiments, the method includes, based on a number of outstanding input/output operations (OIO) of the system being less than a predetermined threshold, operating the system in a partial stripe write mode. In accordance to operating the system in the partial stripe write mode, each of the one or more additional client data blocks may be stored at the corresponding physical address in the current data stripe of the capacity tier. A size of the one or more additional client data blocks may be less than a size of the current data stripe. At least a portion of additional logical map data may be stored in an additional physical address in the current data stripe of the capacity tier.

In at least one embodiment, the capacity tier may be managed by a log-structured file system (LFS). The performance tier may be managed by another file system that enables overwriting the logical map data. The logical map data may be structured as a B+-tree. The logical map data may further includes checksum data associated with each write transaction for each client data block of the set of client data blocks.

In some embodiments, storing each of the one or more additional client data blocks at the corresponding physical address in the current data stripe of the capacity tier includes accessing, from a memory bank in the performance tier, the corresponding parity data for the subset of client data blocks of the current data stripe. The subset of client data blocks of the current data stripe may be updated to include the one or more additional client data blocks. The corresponding parity data for the updated subset of client data blocks of the current data stripe may be updated based on the one or more additional client data blocks. The updated corresponding parity data may be in the memory bank of the performance tier.

In various embodiments, the input/output (I/O) throughput of the performance tier is at least seven times greater than an I/O throughput of the capacity tier. The first plurality of disks may be arranged in a 4+2 RAID 6 configuration. The second plurality of disks may be arranged in a 3-way mirroring configuration. The first layer of the system may be a striped Distributed Object Manager (zDOM). The second layer of the system may be a Distributed Object Manager (DOM).

In still other embodiments, the metadata object may structure the address map as a B-tree (or a binary search tree, a skip list, an in-memory b-tree, a trie, when stored in RAM) that includes a plurality of leaf nodes and a plurality of index nodes. The plurality of index nodes may include pointers to each of the plurality of leaf nodes. The instructions may further be for performing another method. The other method includes determining a storage volume associated with the plurality of leaf nodes that are stored on the performance tier. The other method may additionally comprise, in response to the storage volume of the plurality of leaf nodes stored on the performance tier is greater than a predetermined volume threshold, migrating at least a portion of the plurality of leaf nodes to one or more of the plurality of data stripes of the capacity storage. A portion of the plurality of index nodes that include pointers to the migrated portion of the plurality of leaf nodes may be updated to include updated pointers to physical addresses of the one or more of the plurality of data stripes of the capacity storage that store the migrated portion of the plurality of leaf nodes. A portion of the performance tier that stored the migrated portion of the leaf nodes may be re-allocated to store additional logical map data.

In such embodiments, a first leaf node of the plurality of leaf nodes may encode a key-value pair indicating an entry in the address map for one or more client data blocks of the set of client data blocks. The key of the key-value pair may indicate the logical address of a first client data block of the one or more client data blocks. The value of the key-value pair may indicate the corresponding physical address of the first client data block. The value of the key-value pair may further indicate a number of the one or more client data blocks that have contiguous logical addresses and contiguous physical addresses. In at least one embodiment, the value of the key-value pair further indicates checksum data for each of the one or more client data blocks. The B-tree is a B+-tree. A storage volume of each of the plurality of leaf pages may be 512 bytes. In some embodiments, and prior to migration to the to one or more of the plurality of data stripes, each leaf node in the migrated portion of leaf nodes may be stored in a memory bank of the capacity tier.

In still other embodiments, a system may include a first distributed object manager (DOM), a second DOM, and a local object manage (LOM). The system may further include one or more processors a memory. The first DOM may be a striped DOM (e.g., a zDOM) and the LOM may be a Local Log Structured Data Object Manager (LSOM). The first DOM, the second DOM, and the LOM may be structured as hierarchical layers of the system, where the first DOM is the uppermost layer, the second DOM being a layer below the first DOM, and the LOM being a layer below the second DOM. Client data managed by the system be structured as a set of data blocks in the system. The first DOM may employ a set of logical addresses to reference the set of data blocks. The second DOM may employ a set of physical addresses to reference the set of data blocks. The LOM may employ a set of local addresses to reference the set of data blocks. First mapping data (e.g., zDOM logical map data) may encode a correspondence (or mapping) between the set of logical addresses, employed by the first DOM, and the set of physical addresses, employed by the second DOM. Second mapping data (e.g., LSOM logical map data), may encode a correspondence (or mapping) between the set of physical addresses, and the set of local addresses, employed by the LOM. For each instance when a particular data block of the set of data blocks is written, a LOM transaction ID (e.g., an LSOM transaction or generation ID) of a set of LOM transaction IDs may be generated. The generated LOM transaction ID may be associated with the local addresses that the particular data block was written to (e.g., the local address that the LOM employs to reference the particular data block). A usage table (e.g., a segment usage table) indicates a current status (e.g., valid or invalid) of each LOM transaction ID of the set of LOM transaction IDs.

In various embodiments, each of the first mapping data and the second mapping data are encoded in separate B-Trees. Each of the separate B-Trees may be a B+-Tree. The system may further include a capacity storage tier including a first plurality of storage disks storing a capacity data object structuring the set of client data blocks as a plurality data stripes that are erasure coded (EC) and distributed across the first plurality of disks. Each of the plurality of data stripes may include a subset of the set of client data blocks and corresponding parity data for the subset of client data blocks. The system may further include a performance storage tier including a second plurality of storage disks storing a metadata object structuring the first mapping data as being mirrored across the second plurality of disks. The first plurality of disks may be arranged in a 4+2 RAID 6 configuration. The second plurality of disks may be arranged in a 3-way mirroring configuration. The capacity tier may be managed by a log-structured file system (LFS). The performance tier may be managed by another file system that enables overwriting the first mapping data. The LOM may be a Local Log Structured Data Object Manager (LSOM) that is managed by a log-structured file system (LFS). The first DOM may be a striped Distributed Object Manager (zDOM). The current status of the first LOM transaction ID may have been transitioned from valid to invalid in the usage table in response to a garbage cleaning operation applied by the LOM on the set of data blocks. In at least one embodiment, and in further response to the garbage cleaning operation, a subsequent LOM transition ID and subsequent local address for the first data block may be generated. A current status for the subsequent LOM transition ID may be indicated as valid in the usage table.

The system may perform a non-limiting embodiment of a method for accessing and/or providing the client data to a client. One exemplary embodiment includes receiving, at the first DOM, a request to access a first data block of the set of data blocks. The request may indicate a first logical address of the logical set of addresses that references the first data block. The first mapping data may be employed to identify (or determine) a first physical addresses of the set of physical addresses that corresponds to the first logical addresses. The first mapping data may further encode a candidate local addresses of the set of local addresses. The LOM may have previously employed the candidate local address to reference (or access) the first data block. The first LOM transaction ID of the set of LOM transactions ID may be associated with the candidate local address. The first mapping data may be employed to identify (or determine) the candidate local address and the first LOM transaction ID. In some embodiments, the usage table may be employed to determine (or identify) the current status of the first LOM transaction ID. In some embodiments, and in accordance to determining that the current status of the first LOM transaction ID is valid, the candidate local address may be employed to access the first data block. In accordance to determining that the current status of the first LOM transaction ID is invalid, the second mapping data may be employed to identify (or determine) an updated local address of the set of local addresses. The updated local address may currently reference the first data block. The updated local address may be employed to access the first data block.

In some embodiments, the set of data blocks may be stored on a plurality of disks (e.g., a capacity tier). A first subset of set of data blocks may be stored on a current segment of the plurality of disks. A second subset of the set of data blocks is stored on a previous segment (e.g., a "dirty" segment) of the plurality of disks. Another exemplary embodiment of a method implemented by the system includes receiving, at the LOM, a request to clean client data. The request may include a request to update the current segment of the plurality of disks to include the second subset of data blocks (e.g., to include the live data blocks from the dirty segment in the current segment). The LOM may be employed to access the second subset of data blocks from the previous segment of the plurality of disks. The second subset of data blocks may be transmitted from the LOM to the second DOM. Parity data, based on the second subset of data blocks, may be generated at the second DOM. The parity data may be transmitted from the second DOM to the LOM. In some embodiment, the LOM may be employed to update the second mapping data. In the updated mapping of the second mapping data, each local address of the set of local addresses that references a data block of the second subset of data blocks may be included in the current segment of the plurality of disks. In other embodiments, the LOM may be employed to generate a local copy of each data block of the second subset of data blocks in the current segment. Each local address of the set of local addresses that references a data block of the second subset of data blocks (which were local copied to the current segment) may be included in the current segment of the plurality of disks. The LOM to write the parity data in the current segment of the plurality of disks.

The foregoing descriptions of specific embodiments have been presented for purposes of illustration and description. They are not intended to be exhaustive or to limit the scope of the claims to the precise forms disclosed, and it should be understood that many modifications and variations are possible in light of the above teaching.

What is claimed is:

1. A distributed computing system for managing client data that is structured as a set of data blocks that are stored on a plurality of disks, wherein a first subset of set of data blocks are stored on a current segment of the plurality of disks and a second subset of the set of data blocks is stored on a previous segment of the plurality of disks, the distributed computing system comprising:
- a first distributed object manager (DOM) that employs a set of logical addresses to reference the set of data blocks;
- a second DOM that employs a set of physical addresses to reference the set of data blocks, wherein first mapping data encodes a correspondence between the set of logical addresses and the set of physical addresses;
- a local object manager (LOM) that employs a set of local addresses to reference the set of data blocks, wherein second mapping data encodes a correspondence between the set of physical addresses and the set of local addresses;
- one or more processors; and
- a memory storing one or more programs configured to be executed by the one or more processors, the one or more programs including instructions for:
  - receiving, at the LOM, a request to clean client data, wherein the request includes a request to update the current segment of the plurality of disks to include the second subset of data blocks;
  - employing the LOM to access the second subset of data blocks from the previous segment of the plurality of disks;
  - transmitting, from the LOM to the second DOM, the second subset of data blocks;
  - generating, at the second DOM, parity data based on the second subset of data blocks;
  - transmitting, from the second DOM to the LOM, the parity data;
  - employing the LOM to generate a local copy of the second subset of data blocks such that each local address of the set of local addresses that references the local copy of the second subset of data blocks is included in the current segment of the plurality of disks; and
  - employing the LOM to write the parity data in the current segment of the plurality of disks.

2. The distributed computing system of claim 1, wherein each of the first mapping data and the second mapping data are encoded in separate B-Trees.

3. The distributed computing system of claim 2, wherein each of the separate B-Trees is a B+-Tree.

4. The distributed computing system of claim 1, further comprising:
- a capacity storage tier including a first plurality of storage disks of the plurality of disks storing a capacity data object structuring the set of data blocks as a plurality of data stripes that are erasure coded (EC) and distributed across the first plurality of storage disks, wherein each of the plurality of data stripes includes a subset of the set of data blocks and corresponding parity data for the subset of the set of data blocks.

5. The distributed computing system of claim 4, further comprising:
- a performance storage tier including a second plurality of storage disks of the plurality of disks storing a metadata object structuring the first mapping data as being mirrored across the second plurality of storage disks.

6. The distributed computing system of claim 5, wherein the first plurality of storage disks is arranged in a 4+2 RAID 6 configuration and the second plurality of storage disks is arranged in a 3-way mirroring configuration.

7. The distributed computing system of claim 5, wherein the capacity storage tier is managed by a log-structured file system (LFS) and the performance storage tier is managed by another file system that enables overwriting the first mapping data.

8. The distributed computing system of claim 1, wherein the LOM is a Local Log Structured Data Object Manager (LSOM) that is managed by a log-structured file system (LFS).

9. The distributed computing system of claim 1, wherein the first DOM is a striped Distributed Object Manager (zDOM).

10. The distributed computing system of claim 1, wherein a current status of a first LOM transaction ID was transitioned from valid to expired in a usage table in response to a garbage cleaning operation applied by the LOM on the set of data blocks.

11. A method for enabling a distributed computing system to manage data that is structured as a set of data blocks that are stored on a plurality of disks, wherein a first subset of set of data blocks are stored on a current segment of the plurality of disks and a second subset of the set of data blocks is stored on a previous segment of the plurality of disks, wherein the distributed computing system comprises:
- a first distributed object manager (DOM) that employs a set of logical addresses to reference the set of data blocks;
- a second DOM that employs a set of physical addresses to reference the set of data blocks, wherein first mapping data encodes a correspondence between the set of logical addresses and the set of physical addresses;
- a local object manager (LOM) that employs a set of local addresses to reference the set of data blocks, wherein second mapping data encodes a correspondence between the set of physical addresses and the set of local addresses, and the method comprising:
  - receiving, at the LOM, a request to clean data, wherein the request includes a request to update the current segment of the plurality of disks to include the second subset of data blocks;
  - employing the LOM to access the second subset of data blocks from the previous segment of the plurality of disks;
  - transmitting, from the LOM to the second DOM, the second subset of data blocks;
  - generating, at the second DOM, parity data based on the second subset of data blocks;
  - transmitting, from the second DOM to the LOM, the parity data;
  - employing the LOM to generate a local copy of the second subset of data blocks such that each local address of the set of local addresses that references the local copy of the second subset of data blocks is included in the current segment of the plurality of disks; and
  - employing the LOM to write the parity data in the current segment of the plurality of disks.

12. The method of claim 11, wherein each of the first mapping data and the second mapping data are encoded in separate B-Trees subcomponent.

13. The method of claim 12, wherein each of the separate B-Trees is a B+-Tree.

14. The method claim 11, wherein the system further comprises:
- a capacity storage tier including a first plurality of storage disks storing a capacity data object structuring the set of data blocks as a plurality of data stripes that are erasure coded (EC) and distributed across the first plurality of disks, wherein each of the plurality of data stripes includes a subset of the set of client data blocks and corresponding parity data for the subset of the set of client data blocks.

15. The method claim 14, wherein the system further comprises:
a performance storage tier including a second plurality of storage disks of the plurality of disks storing a metadata object structuring the first mapping data as being mirrored across the second plurality of storage disks.

16. The method of claim 15, wherein the first plurality of disks is arranged in a 4+2 RAID 6 configuration and the second plurality of disks is arranged in a 3-way mirroring configuration.

17. The method of claim 15, wherein the capacity storage tier is managed by a log-structured file system (LFS) and the performance storage tier is managed by another file system that enables overwriting the first mapping data.

18. The method of claim 11, wherein the LOM is a Local Log Structured Data Object Manager (LSOM) that is managed by a log-structured file system (LFS).

19. The method of claim 11, wherein the first DOM is a striped Distributed Object Manager (zDOM).

20. The method of claim 11, wherein a current status of a first LOM transaction ID was transitioned from valid to expired in a usage table in response to a garbage cleaning operation applied by the LOM on the set of data blocks.

21. A non-transitory computer-readable storage medium storing one or more programs configured to be executed by one or more components operating in a distributed-computing system, the one or more components having one or more processors and memory, the one or more programs including instructions for enabling the distributed computing system to manage client data that is structured as a set of data blocks that are stored on a plurality of disks, wherein the distributed computing system comprises:
a first distributed object manager (DOM) that employs a set of logical addresses to reference the set of data blocks;
a second DOM that employs a set of physical addresses to reference the set of data blocks, wherein first mapping data encodes a correspondence between the set of logical addresses and the set of physical addresses;
a local object manager (LOM) that employs a set of local addresses to reference the set of data blocks, wherein second mapping data encodes a correspondence between the set of physical addresses and the set of local addresses, and the instructions comprise:
receiving, at the LOM, a request to clean client data, wherein the request includes a request to update a current segment of the plurality of disks to include a subset of the set of data blocks;
employing the LOM to access the subset of the set of data blocks from a previous segment of the plurality of disks;
transmitting, from the LOM to the second DOM, the subset of data blocks;
generating, at the second DOM, parity data based on the subset of data blocks;
transmitting, from the second DOM to the LOM, the parity data;
employing the LOM to generate a local copy of the subset of data blocks such that each local address of the set of local addresses that references the local copy of the subset of data blocks is included in the current segment of the plurality of disks; and
employing the LOM to write the parity data in the current segment of the plurality of disks.

22. The storage medium of claim 21, wherein each of the first mapping data and the second mapping data are encoded in separate B-Trees.

23. The storage medium of claim 22, wherein each of the separate B-Trees is a B++Tree.

24. The storage medium of claim 21, the distributed computing system further comprising:
a capacity storage tier including a first plurality of storage disks of the plurality of disks storing a capacity data object structuring the set of client data blocks as a plurality of data stripes that are erasure coded (EC) and distributed across the first plurality of disks, wherein each of the plurality of data stripes includes a subset of the set of client data blocks and corresponding parity data for the subset of client data blocks.

25. The storage medium of claim 24, the distributed computing system further comprising:
a performance storage tier including a second plurality of storage disks of the plurality of disks storing a metadata object structuring the first mapping data as being mirrored across the second plurality of storage disks.

26. The storage medium of claim 25, wherein the first plurality of disks is arranged in a 4+2 RAID 6 configuration and the second plurality of disks is arranged in a 3-way mirroring configuration.

27. The storage medium of claim 25, wherein the capacity storage tier is managed by a log-structured file system (LFS) and the performance tier is managed by another file system that enables overwriting the first mapping data.

28. The storage medium of claim 21, wherein the LOM is a Local Log Structured Data Object Manager (LSOM) that is managed by a log-structured file system (LFS).

29. The storage medium of claim 21, wherein the first DOM is a striped Distributed Object Manager (zDOM).

30. The storage medium of claim 21, wherein a current status of a first LOM transaction ID was transitioned from valid to expired in a usage table in response to a garbage cleaning operation applied by the LOM on the set of data blocks.

31. The storage medium of claim 30, wherein in further response to the garbage cleaning operation, a subsequent LOM transaction ID and subsequent local address for a first data block is generated, and a current status for the subsequent LOM transaction ID is indicated as valid in the usage table.

* * * * *